United States Patent
Tahara et al.

(10) Patent No.: US 10,175,577 B2
(45) Date of Patent: Jan. 8, 2019

(54) PHOTOSENSITIVE RESIN COMPOSITION, METHOD FOR MANUFACTURING PATTERNED CURED FILM, AND ELECTRONIC COMPONENT

(71) Applicant: Hitachi Chemical Co., Ltd., Tokyo (JP)

(72) Inventors: Shingo Tahara, Ibaraki (JP); Shigeki Katogi, Ibaraki (JP); Hiroshi Matsutani, Ibaraki (JP); Kouichi Abe, Ibaraki (JP); Akitoshi Tanimoto, Ibaraki (JP); Yu Aoki, Ibaraki (JP)

(73) Assignee: HITACHI CHEMICAL COMPANY, LTD., Tokyo (JP)

(*) Notice: Subject to any disclaimer, the term of this patent is extended or adjusted under 35 U.S.C. 154(b) by 0 days.

(21) Appl. No.: 14/377,323

(22) PCT Filed: Feb. 4, 2013

(86) PCT No.: PCT/JP2013/052479
§ 371 (c)(1),
(2) Date: Aug. 7, 2014

(87) PCT Pub. No.: WO2013/118680
PCT Pub. Date: Aug. 15, 2013

(65) Prior Publication Data
US 2015/0024173 A1    Jan. 22, 2015

(30) Foreign Application Priority Data
Feb. 7, 2012   (JP) .............................. P2012-024007

(51) Int. Cl.
*G03F 7/038* (2006.01)
*G03F 7/40* (2006.01)
(Continued)

(52) U.S. Cl.
CPC .......... *G03F 7/0384* (2013.01); *C08L 33/068* (2013.01); *G03F 7/0233* (2013.01);
(Continued)

(58) Field of Classification Search
None
See application file for complete search history.

(56) References Cited

U.S. PATENT DOCUMENTS 5,677,398 A * 10/1997 Motoshima ......... C08F 290/064
430/280.1
8,338,510 B2   12/2012 Suwa
(Continued)

FOREIGN PATENT DOCUMENTS

| JP | 2005049691 A | 2/2005 |
|---|---|---|
| JP | 2008096609 A | 4/2008 |

(Continued)

OTHER PUBLICATIONS

Search Report issued in counterpart International application PCT/JP2013/052479 dated Aug. 12, 2014.

*Primary Examiner* — Ian A Rummel
(74) *Attorney, Agent, or Firm* — Griffin and Szipl PC

(57) ABSTRACT

The invention provides a photosensitive resin composition comprising (A) an alkali-soluble resin having a phenolic hydroxyl group, (B) a compound that generates an acid by light, and (C) an acrylic resin having a group that crosslinks with the component (A), as well as a method for manufacturing a patterned cured film, and an electronic component prepared therewith.

10 Claims, 7 Drawing Sheets

(51) Int. Cl.
  *C08L 33/06* (2006.01)
  *G03F 7/023* (2006.01)
  *H01L 21/02* (2006.01)
  *H01L 21/311* (2006.01)
(52) U.S. Cl.
  CPC .............. *G03F 7/0236* (2013.01); *G03F 7/40* (2013.01); *H01L 21/02118* (2013.01); *H01L 21/311* (2013.01); *Y10T 428/24802* (2015.01)

(56) References Cited

U.S. PATENT DOCUMENTS

| | | | |
|---|---|---|---|
| 2007/0042296 A1* | 2/2007 | Sasaki et al. | .............. 430/281.1 |
| 2010/0129618 A1 | 5/2010 | Suwa | |
| 2011/0254178 A1 | 10/2011 | Matsutani et al. | |
| 2012/0270151 A1* | 10/2012 | Kikuchi | ................ G03F 7/0226 430/270.1 |

FOREIGN PATENT DOCUMENTS

| | | | |
|---|---|---|---|
| JP | 2008309885 A | 12/2008 |
| JP | 2009015285 A | 1/2009 |
| JP | 2012220855 A | 11/2012 |
| JP | 2012220860 A | 11/2012 |
| TW | 201033736 A | 9/2010 |
| TW | 201129861 A | 9/2011 |

* cited by examiner

PHOTOSENSITIVE RESIN COMPOSITION, METHOD FOR MANUFACTURING PATTERNED CURED FILM, AND ELECTRONIC COMPONENT

This is a National Phase Application in the United States of International Patent Application No. PCT/JP2013/052479 filed Feb. 4, 2013, which claims priority on Japanese Patent Application No. P2012-024007, filed Feb. 7, 2012. The entire disclosures of the above patent applications are hereby incorporated by reference.

TECHNICAL FIELD

The present invention relates to a photosensitive resin composition, and to a method for manufacturing a patterned cured film and to an electronic component employing the same.

BACKGROUND ART

With increasingly high integration and miniaturization of semiconductor elements in recent years, there is a need for the photosensitive resin compositions that are used to form the surface protective layers, interlayer insulating layers and rewiring insulating layers of semiconductor elements, to have more excellent sensitivity and resolution and to be able to form finer and more intricate patterned cured films. As materials having such properties there have been proposed photosensitive resin compositions comprising alkali-soluble resins with phenolic hydroxyl groups (see Patent Literature 1, for example).

CITATION LIST

Patent Literature

[Patent Literature 1] Japanese Unexamined Patent Application Publication No. 2008-309885

SUMMARY OF INVENTION

Technical Problem

On the other hand, as semiconductor elements continue to become more highly integrated, miniaturized and micronized, there is a need for photosensitive resin compositions to be able to form patterned cured films having finer and more intricate patterns. Methods for producing patterned cured films generally comprise a step of coating a photosensitive resin composition on a substrate and drying the formed resin film, a step of exposing the resin film to light, a developing step of removing the exposed sections or unexposed sections with a developing solution, and a step of curing the developed patterned resin film by heating. In the step of curing a fine, intricate patterned resin film by heating, with a conventional photosensitive resin composition, problems have been encountered as the resin film dissolves and the pattern shape and dimensions change (pattern melt).

It is therefore an object of the present invention to provide a photosensitive resin composition being capable of forming patterns with excellent resolution, excellent heat resistance and impact resistance, and being developable with an aqueous alkali solution.

It is another object of the invention to provide a method for manufacturing a patterned cured film using the photosensitive resin composition, and an electronic component comprising the patterned cured film.

Solution to Problem

The present invention relates to the following aspects.

[1] A photosensitive resin composition comprising (A) an alkali-soluble resin with a phenolic hydroxyl group, (B) a compound that generates an acid by light, and (C) an acrylic resin having a group that crosslinks with the component (A).

[2] The photosensitive resin composition wherein the component (C) is an acrylic resin comprising a structural unit represented by the following formula (1):

wherein $R_1$ represents a hydrogen atom or a methyl group, and $R_2$ represents an organic group having a group that crosslinks with component (A).

[3] The photosensitive resin composition wherein the component (C) is an acrylic resin also comprising a structural unit represented by the following formula (2):

wherein $R_3$ represents a hydrogen atom or a methyl group, and $R_4$ represents a C4-20 alkyl group.

[4] The photosensitive resin composition wherein the component (C) is an acrylic resin also comprising a structural unit represented by the following formula (3) or (4):

[5] A photosensitive resin composition comprising the component (C) at 1 to 50 parts by mass with respect to 100 parts by mass of the component (A).

[6] The photosensitive resin composition wherein the component (A) is a phenol resin.

[7] The photosensitive resin composition wherein the component (B) is an o-quinone diazide compound.

[8] The photosensitive resin composition, further comprising (E) an acrylic resin that does not contain a group that crosslinks with the component (A).

[9] The photosensitive resin composition, further comprising (F) a heat acid generator.

[10] A method for manufacturing a patterned cured film, the method comprising a step of coating the photosensitive resin composition onto a substrate and drying the coated photosensitive resin composition to form a resin film, a step of exposing the resin film to light, a step of developing the exposed resin film with an aqueous alkali solution to form a patterned resin film, and a step of heating the patterned resin film.

[11] The method for manufacturing a patterned cured film, wherein the heating temperature in the step of heating the patterned resin film is no higher than 250° C.

[12] An electronic component having a patterned cured film produced by the aforementioned method for manufacturing a patterned cured film as an interlayer insulating layer or a surface protective layer.

[13] An electronic component having a patterned cured film produced by the method for manufacturing a patterned cured film as a cover coat layer, core, collar or underfill.

Advantageous Effects of Invention

According to the invention it is possible to provide a photosensitive resin composition that leaves no residue or has sufficiently reduced generation of residue during development, or in other words exhibits excellent developability, while also limiting film loss at unexposed sections during development, and having satisfactory contrast. In addition, the photosensitive resin composition of the invention has satisfactory photosensitive properties (sensitivity and resolution), the obtained patterned cured film has satisfactory mechanical properties (breaking elongation and elastic modulus) and pattern melt resistance, and the haze value of the patterned cured film can be minimized. Also according to the invention, it is possible to provide a method for manufacturing a patterned cured film using the photosensitive resin composition, and an electronic component comprising the patterned cured film.

DESCRIPTION OF EMBODIMENTS

Figure 1:
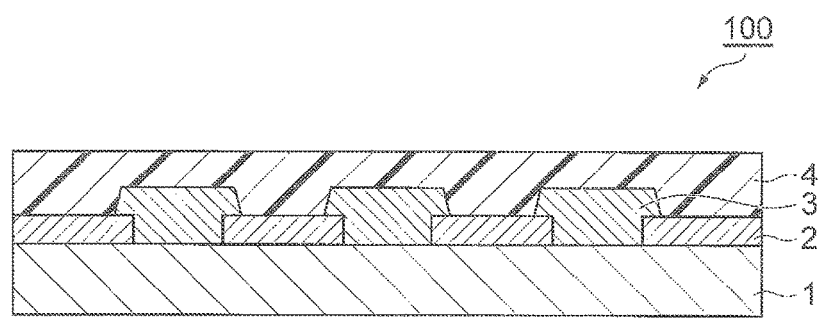
FIG. 1 is a schematic cross-sectional view for explanation of an embodiment of the production steps for a semiconductor device.

The term "(meth)acrylate" used throughout the present specification refers to the "acrylate" and the corresponding "methacrylate". Similarly, the term "(meth)acryl" used throughout the present specification refers to the "acryl" compound and its corresponding "methacryl" compound.

[Photosensitive Resin Composition]

The photosensitive resin composition of this embodiment comprises (A) an alkali-soluble resin having a phenolic hydroxyl group, (B) a compound that generates an acid by light, and (C) an acrylic resin having a group that crosslinks with the component (A) (a reactive group). Each of these components will now be explained.

<Component (A): Alkali-Soluble Resin Having Phenolic Hydroxyl Group>

Component (A) is a resin that has a phenolic hydroxyl group in the molecule and is soluble in alkali developing solutions.

One of the criteria for component (A) being soluble in aqueous alkali solutions will now be explained. A resin composition obtained from component (A) alone and an optional solvent, or component (A) and component (B), component (C) and component (D) explained in order below, with an optional solvent, is spin coated onto a substrate such as a silicon wafer to form a resin film with a film thickness of about 5 μm. The resin film is dipped in any one of a tetramethylammonium hydroxide aqueous solution, a metal hydroxide aqueous solution or an organic amine aqueous solution, at 20° C. to 25° C. When dissolution to a homogeneous solution can be accomplished, it is judged that component (A) is soluble in the aqueous alkali solution.

Examples of alkali-soluble resins having phenolic hydroxyl groups for component (A) include poly(hydroxystyrene)-based resins such as polyhydroxystyrene and copolymers comprising hydroxystyrene as a monomer unit, phenol resins, polybenzooxazole precursors such as poly(hydroxyamide), poly(hydroxyphenylene)ethers and polynaphthols.

Among these, phenol resins are preferred and novolac-type phenol resins are more preferred, for their low cost and low volume shrinkage during curing.

A phenol resin is the polycondensation product of a phenol or its derivative with an aldehyde. Polycondensation is conducted in the presence of a catalyst such as an acid or base. A phenol resin obtained using an acid catalyst is referred to as a novolac-type phenol resin. Examples of novolac-type phenol resins include phenol/formaldehyde-novolac resins, cresol/formaldehyde-novolac resins, xylenol/formaldehyde-novolac resins, resorcinol/formaldehyde-novolac resins and phenol-naphthol/formaldehyde-novolac resins.

Examples of phenol derivatives to be used to obtain phenol resins include alkylphenols such as o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol and 3,4,5-trimethylphenol; alkoxyphenols such as methoxyphenol and 2-methoxy-4-methylphenol; alkenylphenols such as vinylphenol and allylphenol; aralkylphenols such as benzylphenol; alkoxycarbonylphenols such as methoxycarbonylphenol; arylcarbonylphenols such as benzoyloxyphenol; phenol halides such as chlorophenol; polyhydroxybenzenes such as catechol, resorcinol and pyrogallol; bisphenols such as bisphenol A and bisphenol F; naphthol derivatives such as α- and β-naphthol; hydroxyalkylphenols such as p-hydroxyphenyl-2-ethanol, p-hydroxyphenyl-3-propanol and p-hydroxyphenyl-4-butanol; hydroxyalkylcresols such as hydroxyethylcresol; monoethylene oxide addition products of bisphenol; alcoholic hydroxyl-containing phenol derivatives such as monopropylene oxide addition products of bisphenol; and carboxy group-containing phenol derivatives such as p-hydroxyphenylacetic acid, p-hydroxyphenylpropionic acid, p-hydroxyphenylbutanoic acid, p-hydroxycinnamic acid, hydroxybenzoic acid, hydroxyphenylbenzoic acid, hydroxyphenoxybenzoic acid and diphenol. Methylolated forms of the aforementioned phenol derivatives, such as bishydroxymethyl-p-cresol, may also be used as phenol derivatives.

The phenol resin may also be a product obtained by condensation polymerization of an aldehyde with phenol or a phenol derivative together with a compound other than a phenol, such as m-xylene. In this case, the molar ratio of the compound other than a phenol with respect to the phenol derivative used for condensation polymerization is preferably less than 0.5. The phenol derivatives and the compounds other than phenol compounds may be used alone or in combinations of two or more.

Examples of aldehydes to be used to obtain phenol resins include formaldehyde, acetaldehyde, furfural, benzaldehyde, hydroxybenzaldehyde, methoxybenzaldehyde, hydroxyphenylacetaldehyde, methoxyphenylacetaldehyde, crotonaldehyde, chloro acetaldehyde, chlorophenylacetaldehyde, glyceraldehyde, glyoxylic acid, methyl glyoxylate, phenyl glyoxylate, hydroxyphenyl glyoxylate, formylacetic acid, methyl formylacetate, 2-formylpropionic acid and methyl 2-formylpropionate. In addition, formaldehyde precursors such as paraformaldehyde and trioxane; and ketones such as acetone, pyruvic acid, levulinic acid, 4-acetylbutyric acid, acetonedicarboxylic acid and 3,3'-4,4'-benzophenonetetracarboxylic acid, may also be used in the reaction. These may be used as single compounds or as combinations of two or more compounds.

Examples of poly(hydroxystyrene)-based resins to be used include those obtained by polymerization (vinyl polymerization) of the ethylenic unsaturated double bonds of hydroxystyrene having an introduced protecting group in the presence of a catalyst (anionic or radical initiator), further followed by deprotection. There may also be used a commercially available branched poly(hydroxystyrene) such as PHS-B (trade name of DuPont Corp.).

The weight-average molecular weight of component (A) is preferably 500 to 150,000, more preferably 500 to 100,000 and even more preferably 1,000 to 50,000, considering solubility in aqueous alkali solutions and balance between photosensitive properties and patterned cured film mechanical properties. The weight-average molecular weight referred to here is the value obtained by measurement by gel permeation chromatography and calculation using a standard polystyrene calibration curve.

Component (A) may contain a phenol resin without unsaturated hydrocarbon group (A1) and a modified phenol resin with an unsaturated hydrocarbon group (A2). Also, component (A2) may also be modified by reaction between a phenolic hydroxyl and a polybasic acid anhydride. Including component (A2) will improve the cured film adhesiveness and the thermal shock resistance.

Component (A2) may generally be the product of condensation polymerization between the reaction product of a phenol or its derivative and a compound with an unsaturated hydrocarbon group (hereunder also referred to simply as "unsaturated hydrocarbon group-containing compound") (this reaction product will hereunder be referred to as "unsaturated hydrocarbon group-modified phenol derivative"), and an aldehyde. The phenol derivative and aldehyde used to obtain component (A2) may be the same phenol derivative and aldehyde used to obtain the phenol resin described above.

From the viewpoint of patterned cured film adhesiveness and thermal shock resistance, the unsaturated hydrocarbon group of the unsaturated hydrocarbon group-containing compound preferably includes two or more unsaturated bonds, and from the viewpoint of storage stability of the resin composition, the number of unsaturated bonds included is preferably no greater than 30. Also, from the viewpoint of compatibility of a resin composition, and flexibility of the cured film, the unsaturated hydrocarbon group-containing compound is preferably C4-100, more preferably C8-80 and even more preferably C10-60.

Examples of unsaturated hydrocarbon group-containing compounds include polybutadienes with carboxy groups, epoxidated polybutadienes, linoleyl alcohols, oleyl alcohol, unsaturated fatty acids and unsaturated fatty acid esters. Preferred unsaturated fatty acids include crotonic acid, myristoleic acid, palmitoleic acid, oleic acid, elaidic acid, vaccenic acid, gadoleic acid, erucic acid, nervonic acid, linolic acid, α-linolenic acid, eleostearic acid, stearidonic acid, arachidonic acid, eicosapentaenoic acid, clupanodonic acid and docosahexaenoic acid. Of these, unsaturated fatty acid esters are preferred and unsaturated fatty acid ester vegetable oils are more preferred, for compatibility with the base resin and mechanical properties.

Vegetable oils are generally esters of glycerin and unsaturated fatty acids, and they include non-drying oils with iodine values of no greater than 100, semidrying oils with iodine values of greater than 100 and less than 130 and drying oils with iodine values of 130 or greater. Examples of non-drying oils include olive oil, morning glory seed oil, cashew fruit oil, sasanqua oil, camellia oil, castor oil and peanut oil. Examples of semidrying oils include corn oil, cottonseed oil and sesame oil. Examples of drying oils include China wood oil, linseed oil, soybean oil, walnut oil, safflower oil, sunflower oil, perilla oil and mustard seed oil. Processed vegetable oils obtained by processing of these vegetable oils may also be used.

Among these vegetable oils, drying oils are preferably used from the viewpoint of improving the adhesiveness, mechanical properties and thermal shock resistance of the patterned cured film. Also, among drying oils, China wood oil, linseed oil, soybean oil, walnut oil and safflower oil are preferred, and China wood oil and linseed oil are more preferred, because they can more effectively and reliably exhibit the aforementioned effect of the invention. These vegetable oils may be used as single compounds or as combinations of two or more compounds.

For preparation of component (A2), first the phenol derivative and the unsaturated hydrocarbon group-containing compound are reacted to prepare an unsaturated hydrocarbon group-modified phenol derivative. Generally, the reaction is preferably conducted at a reaction temperature of 50° C. to 130° C. The mixing proportion for the phenol derivative and the unsaturated hydrocarbon group-containing compound is preferably 1 to 100 parts by mass and more preferably 5 to 50 parts by mass of the unsaturated hydrocarbon group-containing compound with respect to 100 parts by mass of the phenol derivative, from the viewpoint of allowing the flexibility of the patterned cured film to be increased. A catalyst such as p-toluenesulfonic acid or trifluoromethanesulfonic acid may be used if necessary in the reaction.

Next, the unsaturated hydrocarbon group-modified phenol derivative and the aldehyde are reacted to prepare a modified phenol resin having an unsaturated hydrocarbon group, as component (A2). The reaction between the aldehyde and the unsaturated hydrocarbon group-modified phenol derivative is a polycondensation reaction, and conventionally known phenol resin synthesis conditions may be employed. Component (A2) may also be obtained by combination of a compound obtained by reacting the aforementioned phenol derivative and unsaturated hydrocarbon group-containing compound, and a compound other than a phenol, such as m-xylene, for polycondensation with an aldehyde. The unsaturated hydrocarbon group of component (A2) is preferably present at the ortho position or para position with respect to the phenolic hydroxyl of the phenol resin, and more preferably it is present at the para position.

Component (A2) can also be obtained by reaction between the aforementioned phenol resin and unsaturated hydrocarbon group-containing compound. The reaction between the phenol resin and unsaturated hydrocarbon group-containing compound is preferably conducted at 50° C. to 130° C., for most cases. The mixing proportion for the phenol resin and the unsaturated hydrocarbon group-containing compound is preferably 1 to 100 parts by mass and more preferably 5 to 50 parts by mass of the unsaturated hydrocarbon group-containing compound with respect to 100 parts by mass of the phenol resin, from the viewpoint of allowing the flexibility of the cured film to be increased. A catalyst such as p-toluenesulfonic acid or trifluoromethanesulfonic acid may be used if necessary during the reaction. A solvent such as toluene, xylene, methanol or tetrahydrofuran may be used for the reaction.

As component (A2) there may also be used a phenol resin that has been acid-modified by further reacting a polybasic acid anhydride with the phenolic hydroxyl groups remaining in the modified phenol resin with an unsaturated hydrocarbon group, generated by the method described above. Acid modification with a polybasic acid anhydride introduces carboxy groups and still further improves the solubility of component (A2) in aqueous alkali solutions (developing solutions).

The polybasic acid anhydride is not particularly restricted so long as it has acid anhydride groups formed by dehydrating condensation of the carboxy groups of a polybasic acid having multiple carboxy groups. Examples of polybasic acid anhydrides include dibasic acid anhydrides such as phthalic anhydride, succinic anhydride, octenylsuccinic anhydride, pentadecenylsuccinic anhydride, maleic anhydride, itaconic anhydride, tetrahydrophthalic anhydride, hexahydrophthalic anhydride, methyltetrahydrophthalic anhydride, methylhexahydrophthalic anhydride, nadic anhydride, 3,6-endomethylenetetrahydrophthalic anhydride, methylendomethylenetetrahydrophthalic anhydride, tetrabromophthalic anhydride and trimellitic anhydride, and aromatic tetrabasic acid dianhydrides such as biphenyl tetracarboxylic dianhydrides, naphthalene tetracarboxylic dianhydrides, diphenyl ether tetracarboxylic dianhydrides, butane tetracarboxylic dianhydrides, cyclopentane tetracarboxylic dianhydrides, pyromellitic anhydride and benzophenone tetracarboxylic dianhydrides. These may be used as single compounds or as combinations of two or more compounds. The polybasic acid anhydride is preferably a dibasic acid anhydride among those mentioned above, and is more preferably one or more selected from the group consisting of tetrahydrophthalic anhydride, succinic anhydride and hexahydrophthalic anhydride. This is advantageous as it will allow formation of a patterned cured film with a more satisfactory shape.

Reaction between the phenolic hydroxyl group in the modified phenol resin with an unsaturated hydrocarbon group, and the polybasic acid anhydride, may be conducted at 50° C. to 130° C. For the reaction, preferably 0.1 to 0.8 mol, more preferably 0.15 to 0.6 mol and even more preferably 0.2 to 0.4 mol of the polybasic acid anhydride is reacted with 1 mol of phenolic hydroxyl groups. If the polybasic acid anhydride is reacted at less than 0.1 mol the developability will tend to be reduced, and at greater than 0.8 mol the alkali resistance of the unexposed sections will tend to be reduced.

A catalyst may be added during the reaction as necessary, from the viewpoint of speeding the reaction. Catalysts include, for example, tertiary amines such as triethylamine, quaternary ammonium salts such as triethylbenzylammonium chloride, imidazole compounds such as 2-ethyl-4-methylimidazole and phosphorus compounds such as triphenylphosphine.

The acid value of the phenol resin further modified by a polybasic acid anhydride is preferably 30 to 200 mgKOH/g, more preferably 40 to 170 mgKOH/g and even more preferably 50 to 150 mgKOH/g. If the acid value is 30 mgKOH/g or greater, alkali development will tend to be complete within a short period of time, and if it is no greater than 200 mgKOH/g, the developing solution resistance of the unexposed sections will tend to be improved.

The molecular weight of component (A2) is preferably 1,000 to 500,000, more preferably 2,000 to 200,000 and even more preferably 2,000 to 100,000 as the weight-average molecular weight, considering solubility in aqueous alkali solutions and balance between photosensitive properties and patterned cured film mechanical properties. The weight-average molecular weight referred to here is the value obtained by measurement by gel permeation chromatography and calculation using a standard polystyrene calibration curve.

When a modified phenol resin with an unsaturated hydrocarbon group (A2) is used therewith as component (A) in the photosensitive resin composition, based on the total amount of the phenol resin with an unsaturated hydrocarbon group (A1) and the modified phenol resin with an unsaturated hydrocarbon group (A2) as 100, the mass ratio of former:latter is preferably 5:95 to 95:5, more preferably 10:90 to 90:10 and even more preferably 15:85 to 85:15. The mass ratio is preferably 5:95 to 95:5 from the viewpoint of sensitivity and resolution when forming a patterned resin film, as well as pattern formability after curing, changes in the opening dimensions, and the adhesiveness, mechanical properties and thermal shock resistance of the patterned cured film.

<Component (B): Compound that Generates Acid by Light>

The compound that generates an acid by light, as component (B), may be a photosensitizing agent. Component (B) has the function of generating an acid under photoirradiation, and increasing the solubility of the photoirradiated sections in the aqueous alkali solution. Component (B) may be a compound commonly known as a photoacid generator. Examples for component (B) include o-quinonediazide compounds, aryldiazonium salts, diaryliodonium salts, triarylsulfonium salts and the like. Preferred among these are o-quinonediazide compounds, for their high sensitivity.

The o-quinonediazide compounds can be obtained, for example, by condensation reaction between o-quinonediazidesulfonyl chloride and a hydroxy compound, amino compound or the like, in the presence of a dehydrochlorinating agent.

Examples of o-quinonediazidesulfonyl chlorides to be used for the reaction include benzoquinone-1,2-diazide-4- sulfonyl chloride, 1,2-naphthoquinone-2-diazide-5-sulfonyl chloride and 1,2-naphthoquinone-2-diazide-4-sulfonyl chloride.

Examples of hydroxy compounds to be used for the reaction include hydroquinone, resorcinol, pyrogallol, bisphenol A, bis(4-hydroxyphenyl)methane, 2,2-bis(4-hydroxyphenyl)hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl)methane, bis(2,3,4-trihydroxyphenyl)propane, 4b,5,9b,10-tetrahydro-1,3,6,8-tetrahydroxy-5,10-dimethylindeno[2,1-a]indene, tris(4-hydroxyphenyl)methane, tris(4-hydroxyphenyl)ethane and 1,1-bis(4-hydroxyphenyl)-1-[4-{1-(4-hydroxyphenyl)-1-methylethyl}phenyl]ethane.

Examples of amino compounds to be used in the reaction include p-phenylenediamine, m-phenylenediamine, 4,4'-diaminodiphenyl ether, 4,4'-diaminodiphenylmethane, 4,4'-diaminodiphenylsulfone, 4,4'-diaminodiphenyl sulfide, o-aminophenol, m-aminophenol, p-aminophenol, 3,3'-diamino-4,4'-dihydroxybiphenyl, 4,4'-di amino-3,3-dihydroxybiphenyl, bis(3-amino-4-hydroxyphenyl)propane, bis(4-amino-3-hydroxyphenyl)propane bis(3-amino-4-hydroxyphenyl)sulfone, bis(4-amino-3-hydroxyphenyl)sulfone, bis(3-amino-4-hydroxyphenyl)hexafluoropropane and bis(4-amino-3-hydroxyphenyl)hexafluoropropane.

Of these, from the viewpoint of absorption wavelength range and reactivity, there are preferably used a compound obtained by condensation reaction between 1,1-bis(4-hydroxyphenyl)-1-[4-{1-(4-hydroxyphenyl)-1-methylethyl]phenyl}ethane and 1,2-naphthoquinone-2-diazide-5-sulfonyl chloride, or compounds obtained by condensation reaction between tris(4-hydroxyphenyl)methane or tris(4-hydroxyphenyl)ethane and 1,2-naphthoquinone-2-diazide-5-sulfonyl chloride.

The dehydrochlorinating agent used in the reaction may be, for example, sodium carbonate, sodium hydroxide, sodium hydrogencarbonate, potassium carbonate, potassium hydroxide, trimethylamine, triethylamine, pyridine, or the like. The reaction solvent used may be, for example, dioxane, acetone, methyl ethyl ketone, tetrahydrofuran, diethyl ether, N-methylpyrrolidone or the like.

The o-quinonediazidesulfonyl chloride and the hydroxy compound and/or amino compound are preferably added in amounts such that the total number of moles of hydroxy groups and amino groups is 0.5 to 1 with respect to 1 mol of o-quinonediazidesulfonyl chloride. A preferred mixing proportion for the dehydrochlorinating agent and o-quinonediazidesulfonyl chloride is in the range of between 0.95/1 mol equivalents and 1/0.95 mol equivalents.

The preferred reaction temperature for the reaction is 0° C. to 40° C. and the preferred reaction time is 1 to 10 hours.

The content of component (B) is preferably 3 to 100 parts by mass with respect to 100 parts by mass of component (A), from the viewpoint of increasing the difference in dissolution rate between the exposed section and unexposed section and obtaining more satisfactory sensitivity, while from the viewpoint of minimizing residue after developing, it is more preferably 5 to 50 parts by mass, even more preferably 5 to 30 parts by mass and most preferably 5 to 15 parts by mass.

<Component (C): Acrylic Resin Having Group that Crosslinks with Component (A)>

The acrylic resin having a group that crosslinks with component (A) (a reactive group) as component (C) has excellent compatibility with component (A), and therefore satisfactory developability can be obtained and the reactive group of component (C) crosslinks with the phenolic hydroxyl group of component (A) during curing of the resin film, producing an effect of minimizing pattern melting. The reactive group of component (C) is preferably present in the molecule. Preferred examples of acrylic resins containing reactive groups include acrylic resins containing structural units represented by the following formula (1).

[Chemical Formula 4]

(1)

[In formula (1), $R_1$ represents a hydrogen atom or a methyl group, and $R_2$ represents an organic group having a group that crosslinks with component (A) (a reactive group)]

Examples for the group that crosslinks with component (A) include oxazoline, isocyanate, block isocyanate, oxetane and epoxy groups, among which epoxy groups are preferred from the viewpoint of developing contrast and low-temperature curing properties. Examples of organic groups having groups that crosslink with component (A) include glycidyl, glycidyloxybutyl and 3,4-epoxycyclohexyl groups.

Examples of polymerizable monomers that can provide structural units represented by formula (1) include glycidyl acrylate, glycidyl methacrylate, 4-hydroxybutyl acrylate glycidyl ether, (3,4-epoxycyclohexyl)methyl acrylate and (3,4-epoxycyclohexyl)methyl methacrylate. Of these, from the viewpoint of developability there are preferred glycidyl acrylate and 4-hydroxybutyl acrylate glycidyl ether, with glycidyl methacrylate being more preferred from the viewpoint of mechanical properties.

The compositional ratio of the structural unit represented by formula (1) in the acrylic resin of component (C) is preferably 1 to 25 mol %, more preferably 3 to 20 mol % and even more preferably 5 to 15 mol %, with respect to the total amount of component (C). If the compositional ratio of the structural unit represented by formula (1) is 1 to 25 mol %, it will be possible to further improve the physical properties and melt resistance of the cured film of the photosensitive resin composition. From the viewpoint of lowering the haze value, it is most preferably 1 to 10 mol %.

The acrylic resin having a group that crosslinks with component (A) (a reactive group) as component (C) may further contain a structural unit represented by the following formula (2), from the viewpoint of improving the mechanical properties.

[Chemical Formula 5]

(2)

[In formula (2), $R_3$ represents a hydrogen atom or a methyl group, and $R_4$ represents a C4-20 alkyl group.]

Examples of C4-20 alkyl groups represented by $R_4$ include butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, eicosyl, and their structural isomers.

Examples of polymerizable monomers that provide structural units represented by formula (2) include alkyl esters of (meth)acrylic acid, such as butyl (meth)acrylate, pentyl (meth)acrylate, hexyl (meth)acrylate, heptyl (meth)acrylate, octyl (meth)acrylate, nonyl (meth)acrylate, decyl (meth)acrylate, undecyl (meth)acrylate, dodecyl (meth)acrylate, tridecyl (meth)acrylate, tetradecyl (meth)acrylate, pentadecyl (meth)acrylate, hexadecyl (meth)acrylate, heptadecyl (meth)acrylate, octadecyl (meth)acrylate, nonadecyl (meth)acrylate and eicosyl (meth)acrylate. These polymerizable monomers may be used as single compounds or as combinations of two or more compounds.

The compositional ratio of the structural unit represented by formula (2) in the acrylic resin as component (C) is preferably 50 to 95 mol %, more preferably 55 to 90 mol % and even more preferably 60 to 85 mol %, with respect to the total amount of component (C).

The acrylic resin having a group that crosslinks with component (A) (a reactive group) as component (C) may further contain a structural unit represented by the following formula (3) or (4), from the viewpoint of solubility in alkali developing solutions.

[Chemical Formula 6]

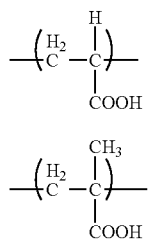

Polymerizable monomers that provide structural units represented by formula (3) include acrylic acid, and polymerizable monomers that provide structural units represented by formula (4) include methacrylic acid.

The compositional ratio of the structural unit represented by formula (3) or (4) in the acrylic resin as component (C) is preferably 1 to 30 mol %, more preferably 3 to 28 mol % and even more preferably 5 to 25 mol %, with respect to the total amount of component (C).

Also, the acrylic resin having a group that crosslinks with component (A) (a reactive group) as component (C) may further contain a structural unit represented by the following formula (5), from the viewpoint of improving compatibility with component (A), adhesiveness of the patterned cured film with the substrate, mechanical properties and thermal shock resistance. Component (C) having a structural unit represented by formula (5) provides more satisfactory interaction with the (A) alkali-soluble resin with a phenolic hydroxyl group, and further improves compatibility.

[Chemical Formula 7]

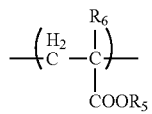

[In formula (5), $R_6$ represents a hydrogen atom or a methyl group, and $R_5$ represents a monovalent organic group with a primary, secondary or tertiary amino group.]

From the viewpoint of allowing the reaction between the reactive groups of component (A) and component (C) to proceed without producing addition reaction with the reactive groups (such as epoxy groups) of component (C), and improving the mechanical properties of the patterned cured film, the structural unit represented by formula (5) preferably has a tertiary amino group.

Examples of polymerizable monomers that can provide structural units represented by formula (5) include aminoethyl (meth)acrylate, N-methyl aminoethyl (meth)acrylate, N,N-dimethylaminoethyl (meth)acrylate, N-ethylaminoethyl (meth)acrylate, N,N-diethylaminoethyl (meth)acrylate, aminopropyl (meth)acrylate, N-methylaminopropyl (meth)acrylate, N,N-dimethylaminopropyl (meth)acrylate, N-ethylaminopropyl (meth)acrylate, N,N-diethylaminopropyl (meth)acrylate, aminoethyl (meth)acrylamide, N-methylaminoethyl (meth)acrylamide, N,N-dimethylaminoethyl (meth)acrylamide, N-ethylaminoethyl (meth)acrylamide, N,N-diethylaminoethyl (meth)acrylamide, aminopropyl (meth)acrylamide, N-methylaminopropyl (meth)acrylamide, N,N-dimethylaminopropyl (meth)acrylamide, N-ethylaminopropyl (meth)acrylamide, N,N-diethylaminopropyl (meth)acrylamide, piperidin-4-yl (meth)acrylate, 1-methylpiperidin-4-yl (meth)acrylate, 2,2,6,6-tetramethylpiperidin-4-yl (meth)acrylate, 1,2,2,6,6-pentamethylpiperidin-4-yl (meth)acrylate, (piperidin-4-yl)methyl (meth)acrylate and 2-(piperidin-4-yl)ethyl (meth)acrylate. These polymerizable monomers may be used as single compounds or as combinations of two or more compounds. From the viewpoint of allowing further improvement in adhesiveness of the patterned cured film to the substrate, and mechanical properties and thermal shock resistance, there are particularly preferred compounds of formula (5) wherein $R_5$ is a monovalent organic group represented by the following formula (6).

[Chemical Formula 8]

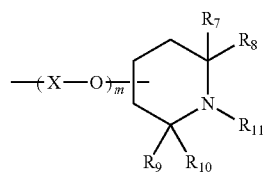

[In formula (6), X represents a C1-5 alkylene group, $R_7$ to $R_{11}$ each independently represent a hydrogen atom or a C1-20 alkyl group, and m represents an integer of 0 to 10.]

Examples of polymerizable monomers that can provide structural units of formula (5) wherein $R_5$ is a monovalent organic group represented by formula (6), include piperidin-4-yl (meth)acrylate, 1-methylpiperidin-4-yl (meth)acrylate, 2,2,6,6-tetramethylpiperidin-4-yl (meth)acrylate, 1,2,2,6,6-pentamethylpiperidin-4-yl (meth)acrylate, (piperidin-4-yl)methyl (meth)acrylate and 2-(piperidin-4-yl)ethyl (meth)acrylate. Among these, 1,2,2,6,6-pentamethylpiperidin-4-yl methacrylate is commercially available as FA-711 MM, and 2,2,6,6-tetramethylpiperidin-4-yl methacrylate is commercially available as FA-712HM (both products of Hitachi Chemical Co., Ltd.).

When the acrylic resin of component (C) includes a structural unit represented by formula (5), the compositional ratio of the structure unit is preferably 0.3 to 10 mol %, more preferably 0.4 to 8 mol % and even more preferably 0.5 to 7 mol %, with respect to the total amount of component (C).

Also, component (C) may further contain a structural unit represented by the following formula (7), from the viewpoint of improving sensitivity.

[Chemical Formula 9]

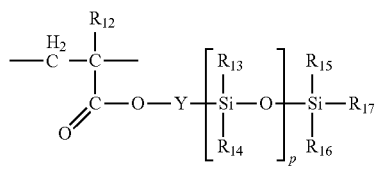

(7)

[In formula (7), $R_{12}$ represents a hydrogen atom or a methyl group, Y represents a C1-5 alkylene group, $R_{13}$ to $R_{17}$ each independently represent a C1-6 alkyl group, and p represents an integer of 1 to 100.]

The polymerizable monomer that provides a structural unit represented by formula (7) may be, for example, a methacryl-modified silicone oil, which is commercially available as X-22-174DX, X-22-2426 or X-22-2475 (all products of Shin-Etsu Chemical Co., Ltd.).

When the acrylic resin of component (C) includes a structural unit represented by formula (7), the compositional ratio of the structure unit is preferably 1 to 10 mol %, more preferably 2 to 5 mol % and even more preferably 3 to 5 mol %, with respect to the total amount of component (C).

Also, the polymerizable monomer to be used for synthesis of the acrylic resin composing component (C) may further include a polymerizable monomer other than polymerizable monomers that provide the structural units represented by formula (1), (2), (3), (4), (5), (6) or (7). Examples of such polymerizable monomers include styrene, α-methylstyrene, benzyl (meth)acrylate, 4-methylbenzyl (meth)acrylate, 2-hydroxyethyl (meth)acrylate, 2-hydroxypropyl (meth) acrylate, 3-hydroxypropyl (meth)acrylate, 4-hydroxybutyl (meth)acrylate, acrylonitrile, vinyl alcohol esters of vinyl-n-butyl ether, tetrahydrofurfuryl (meth)acrylate, glycidyl (meth)acrylate, 2,2,2-trifluoroethyl (meth)acrylate, 2,2,3,3-tetrafluoropropyl (meth)acrylate, (meth)acrylic acid, α-bromo(meth)acrylic acid, α-chloro(meth)acrylic acid, β-furyl(meth)acrylic acid, β-styryl(meth)acrylic acid, maleic acid, maleic anhydride, maleic acid monoesters such as monomethyl malate, monoethyl malate and monoisopropyl malate, and fumaric acid, cinnamic acid, α-cyanocinnamic acid, itaconic acid, crotonic acid, propiolic acid and the like. These polymerizable monomers may be used as single compounds or as combinations of two or more compounds.

The weight-average molecular weight of component (C) is preferably 2,000 to 100,000, more preferably 3,000 to 60,000 and even more preferably 4,000 to 50,000. If the weight-average molecular weight is 2,000 or greater the thermal shock resistance of the cured film will tend to be improved, and if it is no greater than 100,000 the compatibility with component (A) and the developability will tend to be improved. From the viewpoint of developability, the molecular weight is most preferably 4,000 to 9,000.

The content of component (C) is preferably 1 to 50 parts by mass, more preferably 3 to 40 parts by mass and most preferably 5 to 30 parts by mass with respect to 100 parts by mass as the total of component (A), from the viewpoint of adhesiveness, mechanical properties, thermal shock resistance and photosensitive properties.

The reactive group of component (C) can be confirmed using a known method. For example, it can be confirmed using $^{13}C$ NMR, $^{1}H$ NMR, gas chromatography or the like.

<Component (D): Thermal Crosslinking Agent>

The photosensitive resin composition of this embodiment may further comprise a thermal crosslinking agent as component (D). A thermal crosslinking agent is a compound having a structure that can form a crosslinking structure by reacting with component (A), when the pattern-formed photosensitive resin film is heated for curing. This can prevent brittleness of the film and melting of the film. The thermal crosslinking agent used is preferably a compound having a phenolic hydroxyl group, a compound having a hydroxymethylamino group or a compound having an epoxy group.

Compounds with phenolic hydroxyl groups to be used as thermal crosslinking agents differ from component (A), and their concrete structures are described below. Such a compound with a phenolic hydroxyl group is preferred because it not only serves as a thermal crosslinking agent but can also both increase the dissolution rate of the exposed sections during development with an aqueous alkali solution, and improve the sensitivity. The number-average molecular weight of the compound with a phenolic hydroxyl group is preferably no greater than 2,000. In consideration of solubility in aqueous alkali solutions and balance between photosensitive properties and cured film physical properties the number-average molecular weight is preferably 94 to 2,000, more preferably 108 to 2,000 and even more preferably 108 to 1,500.

For the compound with a phenolic hydroxyl group as the thermal crosslinking agent, a known compound may be used, but compounds represented by the following formula (8) are more preferred for an excellent balance between dissolution-accelerating effect at exposed sections, and anti-melting effect during curing of the photosensitive resin film.

[Chemical Formula 10]

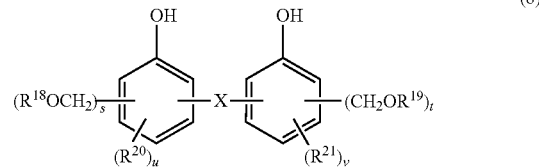

(8)

[In formula (8), X represents a single bond or a divalent organic group, $R_{18}$, $R_{19}$, $R_{20}$ and $R_{21}$ each independently represent a hydrogen atom or a monovalent organic group, s and t each independently represent an integer of 1 to 3, and u and v each independently represent an integer of 0 to 4.]

A compound of formula (8) in which X is a single bond is a biphenol(dihydroxybiphenyl) derivative. The divalent organic group represented by X may be, for example, a C1-10 alkylene group such as methylene, ethylene or propylene, a C2-10 alkylidene group such as ethylidene or a C6-30 arylene group such as phenylene, or any of these hydrocarbon groups wherein some or all of the hydrogen atoms are replaced with halogen atoms such as fluorine atoms, or a sulfonyl, carbonyl, ether bond, thioether bond or amide bond group, or the like.

Examples of compounds with hydroxymethylamino groups include nitrogen-containing compounds in which some or all of the active methylol groups have been alkyletherified such as (poly)(N-hydroxymethyl)melamine, (poly)(N-hydroxymethyl)glycoluryl, (poly)(N-hydroxymethyl)benzoguanamine or (poly)(N-hydroxymethyl)urea. The alkyl groups of the alkyl ethers mentioned here may be methyl, ethyl, butyl or mixtures thereof, and they may also contain partially self-condensed oligomer components. Examples of such compounds include hexakis(methoxymethyl)melamine, hexakis(butoxymethyl)melamine, tetrakis(methoxymethyl)glycoluryl, tetrakis(butoxymethyl)glycoluryl and tetrakis(methoxymethyl)urea.

As compounds with epoxy groups there may be used conventionally known compounds. Examples include bisphenol A-type epoxy resins, bisphenol F-type epoxy resins, phenol-novolac-type epoxy resins, cresol-novolac-type epoxy resins, alicyclic epoxy resins, glycidylamine, heterocyclic epoxy resins and polyalkyleneglycol diglycidyl ethers.

In addition to the compounds mentioned above for the thermal crosslinking agent, there may be used, for example, aromatic compounds with hydroxymethyl groups, such as bis[3,4-bis(hydroxymethyl)phenyl]ether or 1,3,5-tris(1-hydroxy-1-methylethyl)benzene, compounds with maleimide groups, such as bis(4-maleimidephenyl)methane or 2,2-bis[4-(4'-maleimidephenoxy)phenyl]propane, compounds with norbornane skeletons, polyfunctional acrylate compounds, compounds with oxetanyl groups, compounds with vinyl groups, and blocked isocyanato compounds.

Among these thermal crosslinking agent components, from the viewpoint of improving sensitivity and heat resistance, the preferred compounds are those with phenolic hydroxyl groups and compounds with hydroxymethylamino groups, while from the viewpoint of also allowing further improvement in resolution and coating film elongation, the preferred compounds are those with hydroxymethylamino groups, the particularly preferred compounds are those with alkoxymethylamino groups wherein some or all of the hydroxymethylamino groups have been alkyletherified, and the most preferred compounds are those with alkoxymethylamino groups, wherein all of the hydroxymethylamino groups have been alkyletherified.

Particularly preferred among compounds having alkoxymethylamino groups, wherein all of the hydroxymethylamino groups have been alkyletherified, are compounds represented by the following formula (9).

[Chemical Formula 11]

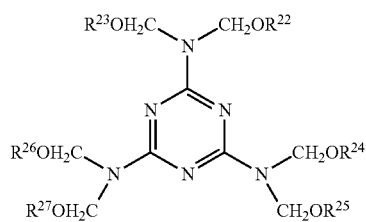

(9)

[In formula (9), $R_{22}$ to $R_{27}$ each independently represent a C1-10 alkyl group.]

When component (D) is present, its content is preferably 1 to 50 parts by mass, more preferably 2 to 30 parts by mass and even more preferably 3 to 25 parts by mass with respect to 100 parts by mass of component (A), from the viewpoint of increasing the difference in dissolution rates of the exposed section and unexposed section and achieving more satisfactory sensitivity, and from the viewpoint of the cured film properties. The aforementioned thermal crosslinking agents may be used as single compounds or as combinations of two or more.

<Component (E): Acrylic Resin>

The photosensitive resin composition for this embodiment may further comprise, as component (E), an acrylic resin that does not contain a group that crosslinks with component (A) (preferably containing no epoxy group). The acrylic resin is preferably an acrylic resin with a structural unit represented by the following formula (10) or (11). If the photosensitive resin composition contains an acrylic resin with a structural unit represented by formula (10) or (11), it will be possible to maintain satisfactory photosensitive properties while improving the thermal shock resistance. Component (E) may consist of a single acrylic resin, or it may contain two or more.

[Chemical Formula 12]

(10)

(11)

[In formulas (10) and (11), $R_{28}$ represents a C4-20 alkyl group and $R_{29}$ represents a hydrogen atom or a methyl group.]

Also in formula (10), $R_{28}$ is preferably a C4-16 alkyl group and preferably a C4 alkyl and more preferably an n-butyl group, from the viewpoint of improving the sensitivity, resolution and thermal shock resistance.

Alkyl (meth)acrylate esters may be mentioned as polymerizable monomers that can provide structural units represented by formula (10). Examples of alkyl (meth)acrylate esters include compounds represented by the following formula (12).

$$CH_2=C(R_{30})-COOR_{31} \quad (12)$$

In formula (12), $R_{30}$ represents a hydrogen atom or a methyl group, and $R_{31}$ represents a C4-20 alkyl group. Examples of C4-20 alkyl groups represented by $R_{31}$ include butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, eicosyl, and their structural isomers. Examples of polymerizable monomers represented by formula (12) include butyl (meth)acrylate, pentyl (meth)acrylate, hexyl (meth)acrylate, heptyl (meth)acrylate, octyl (meth)acrylate, nonyl (meth)acrylate, decyl (meth)acrylate, undecyl (meth)acrylate, dodecyl (meth)acrylate, tridecyl (meth)acrylate, tetradecyl (meth)acrylate, pentadecyl (meth)acrylate, hexadecyl (meth)acrylate, heptadecyl (meth)acrylate, octadecyl (meth)acrylate, nonadecyl (meth)acrylate and eicosyl (meth)acrylate. These polymerizable monomers may be used as single compounds or as combinations of two or more compounds.

The compositional ratio of the structural unit represented by formula (10) in component (E) is preferably 50 to 95 mol %, more preferably 60 to 90 mol % and even more preferably 70 to 85 mol % with respect to the total amount of component (E). A compositional ratio of 50 to 95 mol % for the structural unit represented by formula (10) can further improve the thermal shock resistance of the cured film of the photosensitive resin composition.

Polymerizable monomers that can provide structural units represented by formula (11) include acrylic acid and methacrylic acid.

Also, the compositional ratio of the structural unit represented by formula (11) in the acrylic resin as component (E) is preferably 5 to 35 mol %, more preferably 10 to 30 mol % and even more preferably 15 to 25 mol %, with respect to the total amount of component (E). A compositional ratio of 5 to 35 mol % for the structural unit represented by formula (11) can further improve the compatibility with component (A), as well as the developability of the photosensitive resin composition.

Also, from the viewpoint of improving compatibility with component (A), adhesiveness of the patterned cured film with substrates, mechanical properties and thermal shock resistance, component (E) more preferably includes an acrylic resin having a structural unit represented by formula (10), a structural unit represented by (11) and a structural unit represented by the following formula (13). If component (E) is such an acrylic resin, the interaction between component (E) and the alkali-soluble resin with a phenolic hydroxyl group (A) will be satisfactory, and the compatibility will be increased.

[Chemical Formula 13]

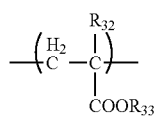

(13)

[In formula (13), $R_{32}$ represents a hydrogen atom or a methyl group, and $R_{33}$ represents a monovalent organic group with a primary, secondary or tertiary amino group.]

Examples of polymerizable monomers that provide structural units represented by formula (13) include aminoethyl (meth)acrylate, N-methylaminoethyl (meth)acrylate, N,N-dimethylaminoethyl (meth)acrylate, N-ethylaminoethyl (meth)acrylate, N,N-diethylaminoethyl (meth)acrylate, aminopropyl (meth)acrylate, N-methylaminopropyl (meth)acrylate, N,N-dimethylaminopropyl (meth)acrylate, N-ethylaminopropyl (meth)acrylate, N,N-diethylaminopropyl (meth)acrylate, piperidin-4-yl (meth)acrylate, 1-methylpiperidin-4-yl (meth)acrylate, 2,2,6,6-tetramethylpiperidin-4-yl (meth)acrylate, 1,2,2,6,6-pentamethylpiperidin-4-yl (meth)acrylate, (piperidin-4-yl)methyl (meth)acrylate and 2-(piperidin-4-yl)ethyl (meth)acrylate. These polymerizable monomers may be used as single compounds or as combinations of two or more compounds. From the viewpoint of allowing further improvement in adhesiveness of the resist pattern to substrates, mechanical properties and thermal shock resistance, there are preferred compounds of formula (13) wherein $R_{33}$ is a monovalent organic group represented by the following formula (14).

[Chemical Formula 14]

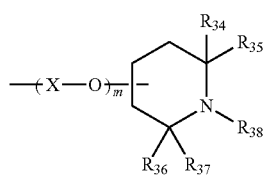

(14)

[In formula (14), X represents a C1-5 alkylene group, $R_{34}$ to $R_{38}$ each independently represent a hydrogen atom or a C1-20 alkyl group, and m represents an integer of 0 to 10]

Examples of polymerizable monomers that can provide structural units of formula (13) wherein $R_{33}$ is a monovalent organic group represented by formula (14), include piperidin-4-yl (meth)acrylate, 1-methylpiperidin-4-yl (meth)acrylate, 2,2,6,6-tetramethylpiperidin-4-yl (meth)acrylate, 1,2,2,6,6-pentamethylpiperidin-4-yl (meth)acrylate, (piperidin-4-yl)methyl (meth)acrylate and 2-(piperidin-4-yl)ethyl (meth)acrylate. Among these, 1,2,2,6,6-pentamethylpiperidin-4-yl methacrylate is commercially available as FA-711MM, and 2,2,6,6-tetramethylpiperidin-4-yl methacrylate is commercially available as FA-7121-1M (both products of Hitachi Chemical Co., Ltd.).

The compositional ratio of the structural unit represented by formula (13) in the acrylic resin as component (E) is preferably 0.3 to 10 mol %, more preferably 0.4 to 8 mol % and even more preferably 0.5 to 7 mol %, with respect to the total amount of component (E).

Also, component (E) may contain an acrylic resin having a structural unit represented by the following formula (15), from the viewpoint of further improving sensitivity.

[Chemical Formula 15]

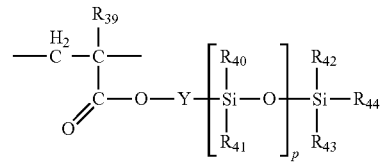

(15)

[In formula (15), $R_{39}$ represents a hydrogen atom or a methyl group, Y represents a C1-5 alkylene group, $R_{40}$ to $R_{44}$ each independently represent a C1-6 alkyl group, and p represents an integer of 1 to 100.]

The polymerizable monomer that provides a structural unit represented by formula (15) may be, for example, a methacryl-modified silicone oil, which is commercially available as X-22-174DX, X-22-2426 or X-22-2475 (all products of Shin-Etsu Chemical Co., Ltd.).

The compositional ratio of the structural unit represented by formula (15) in the acrylic resin as component (E) is preferably 1 to 10 mol %, more preferably 2 to 5 mol % and even more preferably 3 to 5 mol %, with respect to the total amount of component (E).

Also, the polymerizable monomer to be used for synthesis of the acrylic resin composing component (E) may further include a polymerizable monomer other than polymerizable monomers that provide the structural units represented by formula (10), (11), (13) or (15). Such polymerizable monomers include styrene, α-methylstyrene, benzyl (meth)acrylate, 4-methylbenzyl (meth)acrylate, 2-hydroxyethyl (meth)acrylate, 2-hydroxypropyl (meth)acrylate, 3-hydroxypropyl (meth)acrylate, 4-hydroxybutyl (meth)acrylate, acrylonitrile, vinyl alcohol esters of vinyl-n-butyl ether, tetrahydrofurfuryl (meth)acrylate, glycidyl (meth)acrylate, 2,2,2-trifluoroethyl (meth)acrylate, 2,2,3,3-tetrafluoropropyl (meth)acrylate, (meth)acrylic acid, α-bromo(meth)acrylic acid, α-chlor(meth)acrylic acid, β-furyl(meth)acrylic acid, β-styryl(meth)acrylic acid, maleic acid, maleic anhydride, maleic acid monoesters such as monomethyl malate, monoethyl malate and monoisopropyl malate, and fumaric acid, cinnamic acid, α-cyanocinnamic acid, itaconic acid, crotonic acid, propiolic acid and the like. These polymerizable monomers may be used as single compounds or as combinations of two or more compounds.

The weight-average molecular weight of component (E) is preferably 2,000 to 100,000, more preferably 3,000 to 60,000 and even more preferably 4,000 to 50,000. If the weight-average molecular weight is 2,000 or greater the thermal shock resistance of the cured film will tend to be improved, and if it is no greater than 100,000 the compatibility with component (A) and the developability will tend to be improved.

When component (E) is present, its content is preferably 1 to 50 parts by mass, more preferably 3 to 30 parts by mass and most preferably 5 to 20 parts by mass with respect to 100 parts by mass as the total of component (A), from the viewpoint of adhesiveness, mechanical properties, thermal shock resistance and photosensitive properties.

<Other Components>

The photosensitive resin composition for this embodiment may contain other components such as heat acid generators, elastomers, solvents, dissolution accelerators, dissolution inhibitors, surfactants, leveling agents and adhesion aids, as necessary.

<Other Component (F): Heat Acid Generator>

The photosensitive resin composition of this embodiment may further comprise a heat acid generator as component (F). Component (F) is a compound that generates an acid by heat, and it can further inhibit pattern melting. Presumably, this allows an acid to be generated during heating of the photosensitive resin film after development, so that the reaction between component (A) and component (C), i.e. the thermal crosslinking reaction, will initiate from a lower temperature. Also, since component (F) will usually be able to generate acid by photoirradiation, its use can increase the solubility of the exposed sections in aqueous alkali solution. The difference in solubilities of the unexposed sections and exposed sections for the aqueous alkali solution will therefore be increased, thus improving the resolution. For this embodiment, however, a compound different from component (B) is used as component (F).

The compound that generates an acid by heat is preferably a compound that generates an acid by heat at a temperature of, for example, 50° C. to 200° C. Examples for the compound that generates an acid by heat include compounds different from the compound that generates an acid by light for component (B), which may be a salt from a strong acid and a base, such as an onium salt having the function of generating an acid by heat, or an imidosulfonate.

Examples of such onium salts include diaryliodonium salts such as aryldiazonium salts and diphenyliodonium salts; di(alkylaryl)iodonium salts such as diaryliodonium salts and di(t-butylphenyl)iodonium salts; trialkylsulfonium salts such as trimethylsulfonium salts; dialkylmonoarylsulfonium salts such as dimethylphenylsulfonium salts; diarylmonoalkyliodonium salts such as diphenylmethylsulfonium salts, and triarylsulfonium salts. Among these are preferred di(t-butylphenyl)iodonium salt of para-toluenesulfonic acid, di(t-butylphenyl)iodonium salt of trifluoromethanesulfonic acid, trimethylsulfonium salt of trifluoromethanesulfonic acid, dimethylphenylsulfonium salt of trifluoromethanesulfonic acid, diphenylmethylsulfonium salt of trifluoromethanesulfonic acid, di(t-butylphenyl)iodonium salt of nonafluorobutanesulfonic acid, diphenyliodonium salt of camphorsulfonic acid, diphenyliodonium salt of ethanesulfonic acid, dimethylphenylsulfonium salt of benzenesulfonic acid and diphenylmethylsulfonium salt of toluenesulfonic acid.

Among these, sulfonium salts represented by the following formula (16) are preferred, trialkylsulfonium salts of methanesulfonic acid are more preferred, and trimethylsulfonium salts are even more preferred.

[Chemical Formula 16]

(16)

(In formula (16), $R^{45}$, $R^{46}$ and $R^{47}$ each independently represent an alkyl or aryl group, and $R^{43}$ represents a hydrogen atom or a fluorine atom.) Preferred as aryl groups are phenyl or substituted phenyl groups.

Examples of imidosulfonates to be used include naphthoyl imidosulfonate and phthalimido sulfonate.

When the (F) heat acid generator is present, its content is preferably 0.1 to 30 parts by mass, more preferably 0.2 to 20 parts by mass and even more preferably 0.3 to 10 parts by mass, with respect to 100 parts by mass of component (A).

<Other Component (G): Elastomer>

The photosensitive resin composition of this embodiment may further comprise an elastomer as component (G). The obtained resist pattern will thus be even more superior in terms of flexibility, and the mechanical properties and thermal shock resistance of the resist pattern will be able to be further improved. The elastomer that is used may be a known one, but the glass transition temperature (Tg) of the polymer composing the elastomer is preferably no higher than 20° C.

Examples of such elastomers include styrene-based elastomers, olefin-based elastomers, urethane-based elastomers, polyester-based elastomers, polyamide-based elastomers and silicone-based elastomers. The elastomer may also be a fine particulate elastomer. These elastomers may be used as single compounds or as combinations of two or more compounds.

<Component (H): Silane Compound>

The photosensitive resin composition of this embodiment may also contain a silane compound as component (H), from the viewpoint of improving adhesiveness with substrates. Examples of such silane compounds include ureidopropyltriethoxysilane, vinyltriethoxysilane, γ-glycidoxypropyltriethoxysilane, γ-methacryloxypropyltrimethoxysilane, ureapropyltriethoxysilane, methylphenylsilanediol, ethylphenylsilanediol, n-propyl-phenylsilanediol, isopropylphenylsilanediol, n-butyl-phenylsilanediol, isobutylphenylsilanediol, tert-butyl-phenylsilanediol, diphenylsilanediol, ethylmethylphenylsilanol, n-propyl-methylphenylsilanol, isopropylmethylphenylsilanol, n-butyl-methylphenylsilanol, isobutylmethylphenylsilanol, tert-butyl-methylphenylsilanol, ethyl-n-propyl-phenylsilanol, ethylisopropylphenylsilanol, n-butyl-ethylphenylsilanol, isobutylethylphenylsilanl, tert-butyl-ethylphenylsilanol, methyldiphenylsilanol, ethyldiphenylsilanol, n-propyl-diphenylsilanol, isopropyldiphenylsilanol, n-butyl-diphenyl silanol, isobutyldiphenylsilanol, tert-butyl-diphenylsilanol, phenylsilanetriol, 1,4-bis(trihydroxysilyl)benzene, 1,4-bis(methyldihydroxysilyl)benzene, 1,4-bis(ethyldihydroxysilyl)benzene, 1,4-bis(propyldihydroxysilyl)benzene, 1,4-bis(butyldihydroxysilyl)benzene, 1,4-bis(dimethylhydroxysilyl)benzene, 1,4-bis(diethylhydroxysilyl)benzene, 1,4-bis(dipropylhydroxysilyl)benzene, 1,4-bis(dibutylhydroxysilyl)benzene, 3-glycidoxypropyltrimethoxysilane and 3-glycidoxypropyltriethoxysilane. These silane compounds may be used as single compounds or as combinations of two or more compounds. Preferred among these are ureidopropyltriethoxysilane, vinyltriethoxysilane, γ-glycidoxypropyltriethoxysilane, γ-methacryloxypropyltrimethoxysilane, ureapropyltriethoxysilane, 3-glycidoxypropyltrimethoxysilane and 3-glycidoxypropyltriethoxysilane, from the viewpoint of reacting with component (A) and component (C) and improving the adhesion and the breaking elongation of the cured product.

When component (H) is used, its content is preferably 0.1 to 20 parts by mass, more preferably 0.5 to 10 parts by mass and even more preferably 1 to 5 parts by mass with respect to 100 parts by mass of component (A), from the viewpoint of adhesion to wirings and storage stability of the photosensitive resin composition.

<Other Component (I): Solvent>

The photosensitive resin composition of this embodiment may also contain a solvent as component (I), from the viewpoint of coatability onto substrates and from the viewpoint of allowing a resin film with uniform thickness to be formed. Examples of solvents include γ-butyrolactone, ethyl lactate, propyleneglycol monomethyl ether acetate, benzyl acetate, n-butyl acetate, ethoxyethyl propionate, 3-methylmethoxy propionate, N-methyl-2-pyrrolidone, N,N-dimethylformamide, N,N-dimethylacetamide, dimethyl sulfoxide, hexamethylphosphorylamide, tetramethylenesulfone, diethyl ketone, diisobutyl ketone, methyl amyl ketone, cyclohexanone, propyleneglycol monomethyl ether, propyleneglycol monopropyl ether, propyleneglycol monobutyl ether and dipropyleneglycol monomethyl ether. These may be used as single solvents or as combinations of two or more compounds. When component (I) is added, its content is not particularly restricted, but the proportion of solvent in the photosensitive resin composition is preferably adjusted to 20 to 90 mass %.

<Other Component (J): Dissolution Accelerator>

The photosensitive resin composition of this embodiment may further comprise a dissolution accelerator as component (J). By adding (J) a dissolution accelerator, it is possible to increase the dissolution rate at the exposed sections during development of the patterned resin film with an aqueous alkali solution, and to improve the sensitivity and resolution. Any conventionally known dissolution accelerator may be used. Specific examples include compounds with carboxyl, sulfonic acid and sulfonamide groups.

When such a dissolution accelerator is added, its content may be determined by the dissolution rate of the patterned resin film in an aqueous alkali solution, and it is preferably, for example, 0.01 to 30 parts by mass with respect to 100 parts by mass of component (A).

<Other Component (K): Dissolution Inhibitor>

The photosensitive resin composition of this embodiment may further comprise a dissolution inhibitor as component (K). A (K) dissolution inhibitor is a compound that inhibits solubility of component (A) in the aqueous alkali solution, and it is used to control the residual film thickness, the developing time and the contrast. Specific examples thereof include diphenyliodonium nitrate, bis(p-tert-butylphenyl)iodonium nitrate, diphenyliodonium bromide, diphenyliodonium chloride and diphenyliodonium iodide. When a dissolution inhibitor is added, its content is preferably 0.01 to 20 parts by mass, more preferably 0.01 to 15 parts by mass and even more preferably 0.05 to 10 parts by mass with respect to 100 parts by mass of the total amount of component (A), from the viewpoint of the permissible ranges for sensitivity and developing time.

<Other Component (L): Surfactant or Leveling Agent>

The photosensitive resin composition of this embodiment may further comprise a surfactant or leveling agent as component (L). If the photosensitive resin composition contains component (L), this can improve the coatability, prevent striation (film thickness irregularities) and the like, and improve the developability. Examples of such surfactants or leveling agents include polyoxyethylene lauryl ether, polyoxyethylene stearyl ether, polyoxyethylene oleyl ether and polyoxyethylene octylphenol ether. Commercial products include MEGAFACS F171, F173 and R-08 (trade names of Dainippon Ink and Chemicals, Inc.), FLUORAD FC430 and FC431 (trade names of Sumitomo 3M), and the organosiloxane polymers KP341, KBM303 and KBM803 (trade names of Shin-Etsu Chemical Co., Ltd.). When a component (L) is added, its content is preferably 0.001 to 5 parts by mass and more preferably 0.01 to 3 parts by mass with respect to 100 parts by mass of component (A).

The photosensitive resin composition of this embodiment may be developed using an aqueous alkali solution such as tetramethylammonium hydroxide (TMAH). By using such a photosensitive resin composition, it is possible to form a patterned cured film having satisfactory adhesiveness and having crack resistance in the heat shock cycle. Also, the photosensitive resin composition of this embodiment has satisfactory photosensitive properties (sensitivity and resolution) and pattern melt resistance, as well as sufficient mechanical properties (breaking elongation and elastic modulus).

The photosensitive resin composition of this embodiment will generally be a positive-type photosensitive resin composition, but there is no restriction thereto.

[Method for Manufacturing Patterned Cured Film]

The method for manufacturing a patterned cured film according to this embodiment generally comprises a step of coating and drying the aforementioned photosensitive resin composition on a support substrate to form a photosensitive resin film (film formation step), a step of exposing the photosensitive resin film to light (exposure step), a step of developing the exposed photosensitive resin film using an aqueous alkali solution to form a patterned resin film (developing step) and a step of heating the patterned resin film (heating step).

<Film Formation Step>

In the film formation step, the photosensitive resin composition is spin coated onto a support substrate such as a glass substrate, semiconductor, metal oxide insulator (for example, $TiO_2$ and $SiO_2$) or silicon nitride, using a spinner or the like. The coated photosensitive resin composition is dried by heating using a hot plate, oven or the like. This forms a coated film of the photosensitive resin composition (photosensitive resin film) on the substrate.

<Exposure Step>

In the exposure step, the photosensitive resin film formed on the substrate is irradiated with active light rays such as ultraviolet rays, visible light rays or radiation, through a mask. Since component (A) has high transparency for i-lines, irradiation with i-lines is preferably employed. After exposure, post-exposure baking (PEB) may be carried out if necessary. The temperature for post-exposure baking is preferably 70° C. to 140° C., and the time for post-exposure baking is preferably 1 to 5 minutes.

<Developing Step>

In the developing step, the exposed sections of the photosensitive resin film after the exposure step are removed with a developing solution for patterning of the photosensitive resin film. Examples of developing solutions that may be suitably used include aqueous alkali solutions such as sodium hydroxide, potassium hydroxide, sodium silicate, ammonia, ethylamine, diethylamine, triethylamine, triethanolamine and tetramethylammonium hydroxide (TMAH). The base concentration of these aqueous solutions is preferably 0.1 to 10 mass %. An alcohol or surfactant may also be added to the developing solution for use. These may be added in ranges of preferably 0.01 to 10 parts by mass and more preferably 0.1 to 5 parts by mass each with respect to 100 parts by mass of the developing solution. The patterned photosensitive resin film will be referred to as "patterned resin film".

<Heating Step>

In the heat treatment step, the patterned resin film is heated to cure the photosensitive resin composition. The film obtained by curing the patterned resin film will be referred to as "patterned cured film". The heating temperature is preferably no higher than 250° C. and more preferably no higher than 225° C., and even more preferably 140° C. to 200° C., from the viewpoint of adequately preventing damage to the electronic device by heat. The heat treatment may be carried out using an oven such as, for example, a quartz tube furnace, hot plate, rapid thermal annealing, vertical diffusion furnace, infrared curing furnace, electron beam curing furnace or microwave curing furnace. It may be conducted in an atmosphere of air or an inert atmosphere of nitrogen or the like, but treatment under a nitrogen atmosphere is preferred as it can prevent oxidation of the pattern. Since the aforementioned preferred heating temperature range is lower than the conventional heating temperature, it is possible to minimize damage to the support substrate or electronic device. Thus, using the method for producing a resist pattern according to this embodiment allows high-yield production of electronic devices. This is also associated with energy savings for the process. Moreover, because the photosensitive resin composition of this embodiment exhibits a low degree of the volume shrinkage (cure shrinkage) in the heat treatment step that is observed with photosensitive polyimide resins and the like, it is possible to avoid reduction in dimensional precision.

The heating time in the heating step may be a time sufficient for the photosensitive resin composition to cure, but it is generally preferred to be no longer than 5 hours, for satisfactory balance with working efficiency. The heating may be carried out in an oven as described above, or using a microwave curing apparatus or a frequency-variable microwave curing apparatus. By using such apparatuses it is possible to efficiently heat the photosensitive resin film alone while maintaining the temperature of the substrate and electronic device at no higher than 200° C., for example.

With this method for manufacturing a patterned cured film it is possible to obtain a photosensitive resin composition with satisfactory photosensitive properties, and to obtain a patterned cured film having satisfactory pattern formability. Using the photosensitive resin composition of this embodiment allows curing to be accomplished even at a low temperature of 200° C. or below in the heating step, which has conventionally required a temperature of 300° C. or higher. In addition, the patterned cured film formed from the photosensitive resin composition of this embodiment has a high glass transition temperature. The resulting patterned cured film therefore has excellent heat resistance. As a result, it is possible to achieve efficient, high-yield production of electronic devices such as semiconductor devices with excellent reliability.

[Semiconductor Device Production Steps]

The production steps for a semiconductor device will now be explained with reference to the attached drawings, as an example of a method for manufacturing a patterned cured film according to this embodiment. FIGS. 1 to 5 are schematic cross-sectional views showing an embodiment of the production steps for a semiconductor device with a multi-layer wiring structure.

First, the structure 100 shown in FIG. 1 is prepared. The structure 100 comprises a semiconductor substrate 1 such as a Si substrate with a circuit element, a protective layer 2 such as a silicon oxide film having a prescribed pattern in which the circuit element is exposed, and covering the semiconductor board 1, a first conductive layer 3 formed on the exposed circuit element, and an interlayer insulating layer 4 composed of a polyimide resin, formed as a film on the protective layer 2 and first conductive layer 3 by spin coating or the like.

Figure 2:
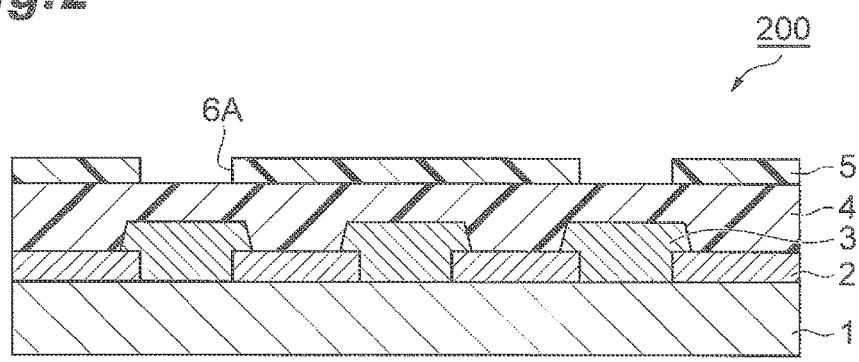
FIG. 2 is a schematic cross-sectional view for explanation of an embodiment of the production steps for a semiconductor device.

A photosensitive resin layer 5 having a window section 6A is then formed on the interlayer insulating layer 4 to obtain the structure 200 shown in FIG. 2. The photosensitive resin layer 5 is formed, for example, by coating a photosensitive resin such as a chlorinated rubber-based, phenol-novolac-based, polyhydroxystyrene-based or polyacrylic acid ester-based resin by spin coating. The window section 6A is formed by a known photoengraving technique in such a manner that a prescribed section of the interlayer insulating layer 4 is exposed.

Figure 3:
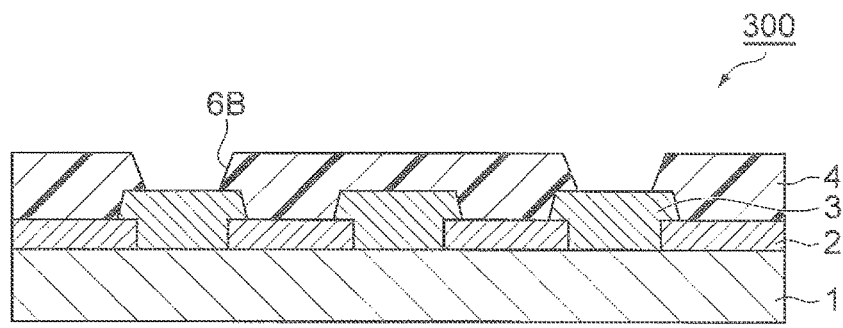
FIG. 3 is a schematic cross-sectional view for explanation of an embodiment of the production steps for a semiconductor device.

After the interlayer insulating layer 4 has been etched to form the window section 6B, the photosensitive resin layer 5 is removed to obtain the structure 300 shown in FIG. 3. Dry etching means employing a gas such as oxygen or carbon tetrafluoride may be used for etching of the interlayer insulating layer 4. The etching selectively removes the section of the interlayer insulating layer 4 corresponding to the window section 6A, to obtain an interlayer insulating layer 4 having the window section 6B formed in such a manner that the first conductive layer 3 is exposed. Next, an etching solution that erodes only the photosensitive resin layer 5 without eroding the first conductive layer 3 exposed through the window section 6B, is used to remove the photosensitive resin layer 5.

Figure 4:
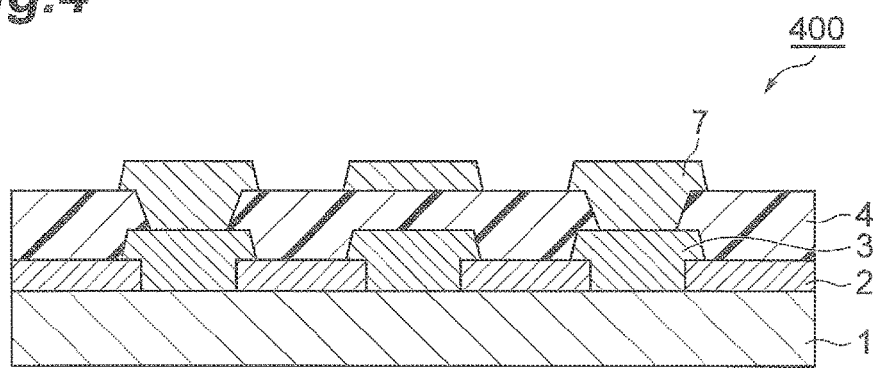
FIG. 4 is a schematic cross-sectional view for explanation of an embodiment of the production steps for a semiconductor device.

A second conductive layer 7 is also formed on the section corresponding to the window section 6B to obtain the structure 400 shown in FIG. 4. A known photoengraving technique may be employed to form the second conductive layer 7. This accomplishes electrical connection between the second conductive layer 7 and the first conductive layer 3.

Figure 5:
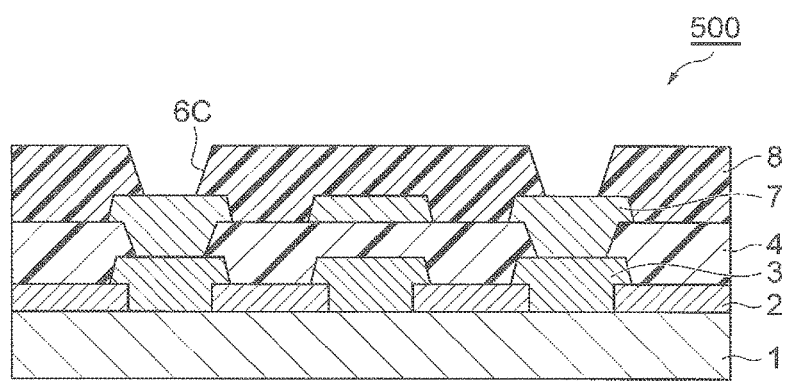
FIG. 5 is a schematic cross-sectional view for explanation of an embodiment of the production steps for a semiconductor device.

Finally, a surface protective layer 8 is formed on the interlayer insulating layer 4 and second conductive layer 7 to obtain the semiconductor device 500 shown in FIG. 5. For this embodiment, the surface protective layer 8 is formed in the following manner. First, the photosensitive resin composition of the embodiment described above is coated onto the interlayer insulating layer 4 and second conductive layer 7 by spin coating, and dried to form a photosensitive resin film. Next, the prescribed sections are photoirradiated through a mask having a pattern drawn corresponding to the window section 6C, and are then developed with an aqueous alkali solution for patterning of the photosensitive resin film. This is followed by heating of the photosensitive resin film for curing, to form a film as the surface protective layer 8. The surface protective layer 8 protects the first conductive layer 3 and second conductive layer 7 from external stress, α-rays and the like, and therefore the semiconductor device 500 has excellent reliability.

The embodiment described above is for a method for manufacturing a semiconductor device having a two-layer wiring structure, but when a multilayer wiring structure having a three-layer or greater structure is to be formed, the aforementioned steps may be repeated for formation of each layer. Specifically, each step for formation of the interlayer insulating layer 4 and each step for formation of the surface protective layer 8 may be repeated to form a multilayer pattern. Also, in the example described above, the interlayer insulating layer 4 may be formed using a photosensitive resin composition of this embodiment, instead of only the surface protective layer 8.

[Electronic Component]

An electronic component according to this embodiment will now be explained. An electronic component of this embodiment has a patterned cured film formed by the manufacturing method described above, as an interlayer insulating layer or surface protective layer. For example, the patterned cured film may be used as a surface protective layer or interlayer insulating layer for a semiconductor device, or an interlayer insulating layer for a multilayer wiring board. The electronic component of this embodiment is not particularly restricted so long as it has a surface protective layer or interlayer insulating layer formed using the photosensitive resin composition described above, and it may have any of a variety of structures.

Furthermore, since the photosensitive resin composition has excellent stress-relaxation and adhesion properties, it can even be used as a structural material for packages with different types of structures that have been developed in recent years. Examples of cross-sectional structures for such a semiconductor device are shown in FIG. 6 and FIG. 7.

Figure 6:
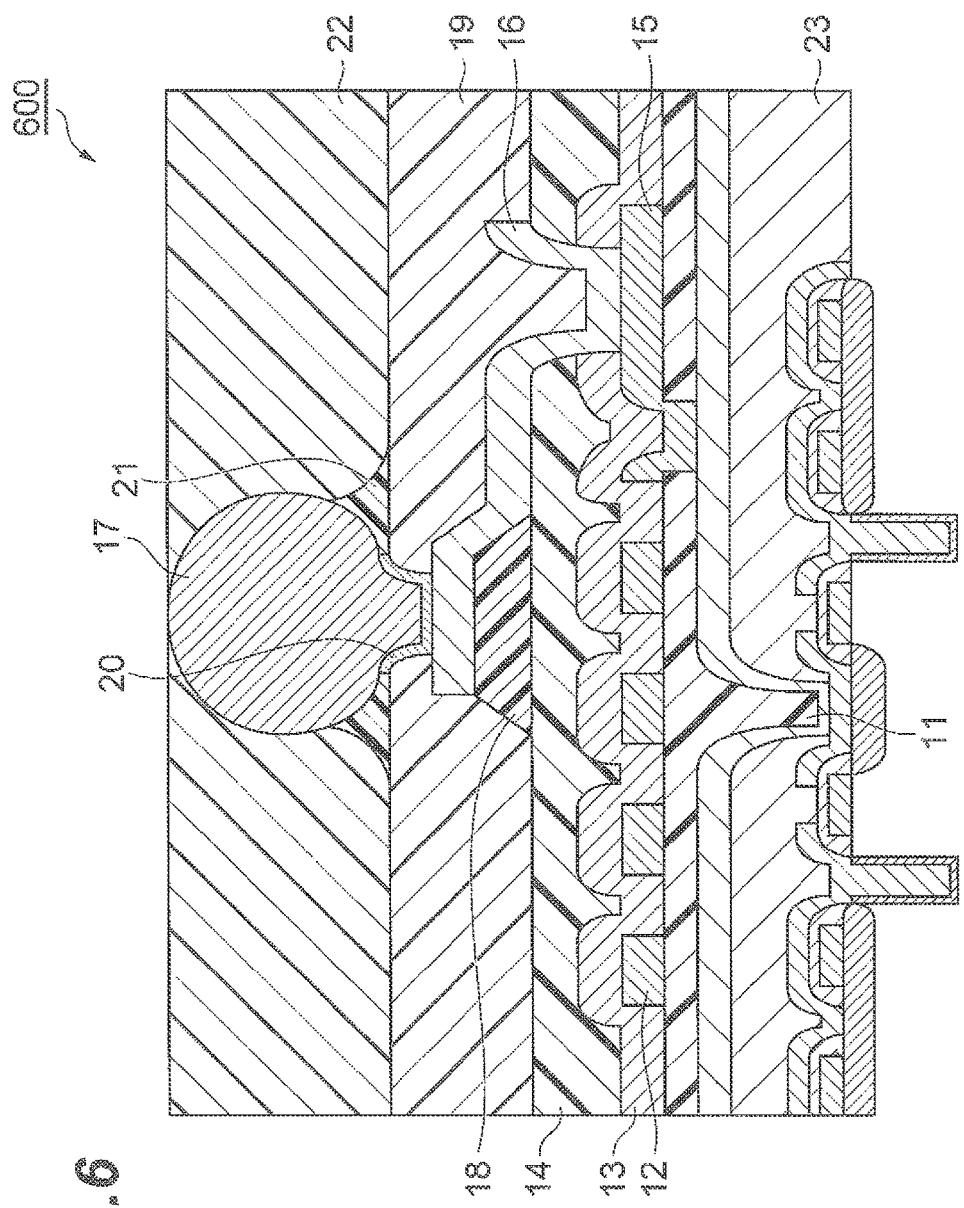
FIG. 6 is a schematic cross-sectional view showing an embodiment of an electronic component (semiconductor device).

FIG. 6 is a schematic cross-sectional view showing a wiring structure as an embodiment of a semiconductor device. The semiconductor device 600 shown in FIG. 6 comprises a silicon chip 23, an interlayer insulating layer 11 formed on one side of the silicon chip 23, an Al wiring layer 12 with a pattern including a pad section 15, formed on the interlayer insulating layer 11, an insulating layer 13 (for example, a P-SiN layer) and a surface protective layer 14 laminated in that order on the interlayer insulating layer 11 and the Al wiring layer 12 while forming an opening over the pad section 15, an island-shaped core 18 situated near the opening on the surface protective layer 14, and a rewiring layer 16 contacting with the pad section 15 inside the opening of the insulating layer 13 and the surface protective layer 14, and extending onto the surface protective layer 14 so as to contact with the side of the core 18 opposite the surface protective layer 14 side. In addition, the semiconductor device 600 comprises a cover coat layer 19 formed covering the surface protective layer 14, the core 18 and the rewiring layer 16, with an opening formed at the section of the rewiring layer 16 over the core 18, a conductive ball 17 connecting with the rewiring layer 16 through a barrier metal 20 at the opening of the cover coat layer 19, a collar 21 that holds the conductive ball, and an underfill 22 formed on the cover coat layer 19 surrounding the conductive ball 17. The conductive ball 17 is used as an external connecting terminal, and it is formed of solder, gold or the like. The underfill 22 is provided for relaxation of stress when the semiconductor device 600 is mounted.

Figure 7:
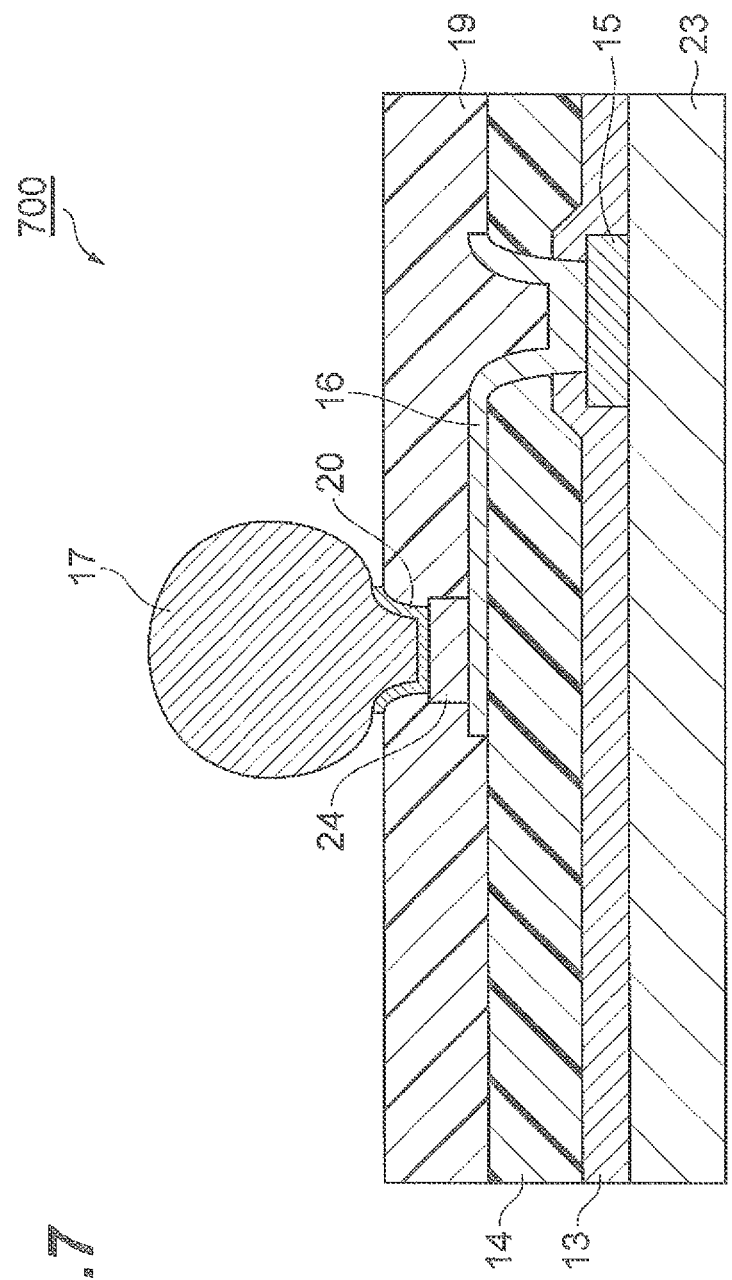
FIG. 7 is a schematic cross-sectional view showing an embodiment of an electronic component (semiconductor device).

FIG. 7 is a schematic cross-sectional view showing a wiring structure as an embodiment of a semiconductor device. In the semiconductor device 700 of FIG. 7 there are formed an Al wiring layer (not shown) and a pad section 15 of the Al wiring layer on a silicon chip 23, with an insulating layer 13 formed thereover and an element surface protective layer 14 additionally foamed. On the pad section 15 there is formed a rewiring layer 16, the rewiring layer 16 extending to the top of a joint 24 with a conductive ball 17. A cover coat layer 19 is also formed on the surface protective layer 14. The rewiring layer 16 is connected to the conductive ball 17 through a barrier metal 20.

In the semiconductor devices shown in FIG. 6 and FIG. 7, the photosensitive resin composition can be used as a material to form not only the interlayer insulating layer 11 or surface protective layer 14, but also the cover coat layer 19, core 18, collar 21 and underfill 22 and the like. The cured product of the photosensitive resin composition has excellent adhesion with metal layers such as the Al wiring layer 12 and rewiring layer 16 (for example, Cu, Au, Ni, Ti or the like), and with sealing compounds, while also having a high stress relaxation effect, and therefore a semiconductor device employing the cured product in the surface protective layer 14, the cover coat layer 19, the core 18, the collar 21 made of solder or the like, or an underfill 22 used in flip-chips and the like, exhibits very excellent reliability.

The photosensitive resin composition of this embodiment is particularly suitable for use in the surface protective layer 14 and/or cover coat layer 19 of a semiconductor device having a rewiring layer 16, as in FIG. 6 and FIG. 7.

The thickness of the surface protective layer or cover coat layer is preferably 3 to 20 μm and more preferably 5 to 15 μm.

By using the aforementioned photosensitive resin composition in the manner described above, it is possible to minimize change in the pattern shape and dimensions (pattern melt) and to reduce the haze value. Moreover, curing can be accomplished by low-temperature heating at 200° C. or below in the heat treatment step, which has conventionally required a temperature of 300° C. or higher. The heating temperature in the heat treatment step is preferably 100° C. to 200° C. and more preferably 150° C. to 200° C. Moreover, because the photosensitive resin composition of this embodiment exhibits a low degree of the volume shrinkage (cure shrinkage) in the heat treatment step that has been observed with photosensitive polyimide resins and the like, it is possible to avoid reduction in dimensional precision. A patterned cured film formed from the photosensitive resin composition of this embodiment has a high glass transition temperature. It can therefore serve as a surface protective layer and interlayer insulating layer with excellent heat resistance. As a result, it allows efficient, high-yield production of electronic components such as semiconductor devices with excellent reliability.

The present invention is not in any way limited to the preferred embodiment described above.

EXAMPLES

The present invention will now be explained in greater detail by examples. However, the invention is not limited to these examples.

<Preparation of Photosensitive Resin Composition>

First, A1 and A2 below were prepared as component (A).

A1: A cresol-novolac resin (cresol/formaldehyde-novolac resin, m-cresol/p-cresol (molar ratio)=60/40, polystyrene-based weight-average molecular weight=13,000, trade name "EP4020G" by Asahi Organic Chemicals Industry Co., Ltd.) was prepared.

A2: Modified phenol resin synthesized by the method described in Synthesis Example 1 below.

Synthesis Example 1

Synthesis of Phenol Resin (A2) Modified by Compound with C4-100 Unsaturated Hydrocarbon Group After combining 100 parts by mass of phenol, 43 parts by mass of linseed oil and 0.1 part by mass of trifluoromethanesulfonic acid, the mixture was stirred at 120° C. for 2 hours to obtain a vegetable oil-modified phenol derivative (a). Next, 130 g of the vegetable oil-modified phenol derivative (a), 16.3 g of paraformaldehyde and 1.0 g of oxalic acid were combined and the mixture was stirred at 90° C. for 3 hours. The mixture was then heated to 120° C. and stirred under reduced pressure for 3 hours, after which 29 g of succinic anhydride and 0.3 g of triethylamine were added and the reaction mixture was stirred at 100° C. for 1 hour under atmospheric pressure. The reaction mixture was cooled to room temperature to obtain a phenol resin A2 modified by a compound with a C4-100 unsaturated hydrocarbon group as the reaction product (acid value: 120 mgKOH/g). The weight-average molecular weight of A2 determined by GPC, based on standard polystyrene, was approximately 25,000.

The measuring conditions for the weight-average molecular weight by GPC were as follows.
Measuring apparatus: L4000 UV detector by Hitachi, Ltd.
Pump: L6000 by Hitachi, Ltd.
C-R4A Chromatopac by Shimadzu Corp.
Measuring conditions: Gelpack GL-S300 MDT-5 column×2
Eluent: THF/DMF=1/1 (volume ratio)
LiBr (0.03 mol/l), $H_3PO_4$ (0.06 mol/l)
Flow rate: 1.0 ml/min, detector: UV270 nm
Measurement was performed using a solution with 1 ml of solvent [THF/DMF=1/1 (volume ratio)] with respect to 0.5 mg of measuring sample.

B1 below was prepared as component (B).
B1: 1,2-Naphthoquinone-2-diazide-5-sulfonic acid ester of 1,1-bis(4-hydroxyphenyl)-1-[4-{1-(4-hydroxyphenyl)-1-methylethyl}phenyl]ethane (esterification rate: approximately 90%, trade name "TPPA528", by AZ Electronic Materials).

C1 to C4 were synthesized by the method of Synthesis Example 2 below, as component (C).

Synthesis Example 2

Synthesis of Acrylic Resins (C1 to C4)

Into a 500 ml three-necked flask equipped with a stirrer, nitrogen inlet tube and thermometer there were weighed out 75 g of toluene and 75 g of isopropanol (IPA), and there were added the polymerizable monomers butyl acrylate (BA), acrylic acid (AA) and glycidyl methacrylate (GMA) in the contents listed in Table 1, and 0.13 g of azobisisobutyronitrile (AIBN) (0.70 g only for C4). While stirring at room temperature with a stirring rotational speed of approximately 270 $min^{-1}$, nitrogen gas was introduced for 30 minutes at a flow rate of 400 ml/min, and the dissolved oxygen was removed. The nitrogen gas stream was then cut off and the flask was sealed and warmed to 65° C. for approximately 25 minutes in a thermobath. The same temperature was maintained for 14 hours for polymerization reaction to obtain acrylic resins C1 to C4. The polymerization rate was 98%.

Also, the weight-average molecular weights (Mw) of C1 to C4, determined by GPC based on standard polystyrene, are shown in Table 1.

TABLE 1

| Polymerizable monomer | C1 | C2 | C3 | C4 |
|---|---|---|---|---|
| GMA | 5 g (35 mmol) | 10 g (70 mmol) | 20 g (140 mmol) | 20 g (140 mmol) |
| BA | 85 g (670 mmol) | 85 g (670 mmol) | 85 g (670 mmol) | 85 g (670 mmol) |
| AA | 14 g (200 mmol) | 14 g (200 mmol) | 14 g (200 mmol) | 14 g (200 mmol) |
| Weight-average molecular weight | 10,000 | 10,000 | 10,000 | 7,000 |

GMA: Glycidyl methacrylate
BA: n-Butyl acrylate
AA: Acrylic acid

D1 Below was Prepared as Component (D).
D1: Hexakis(methoxymethyl)melamine represented by the following formula D1 (trade name NIKALAC MW-30HM" by Sanwa Chemical Co., Ltd.).

[Chemical Formula 17]

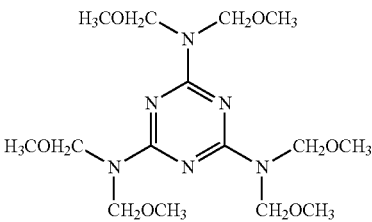

D1

E1 was synthesized by the method described in Synthesis Example 3 below, as component (E).

Synthesis Example 3

Synthesis of Acrylic Resin (E1)

Into a 500 ml three-necked flask equipped with a stirrer, nitrogen inlet tube and thermometer there were weighed out 75 g of toluene and 75 g of isopropanol (IPA), and there were added as separately weighed-out polymerizable monomers 85 g (670 mmol) of butyl acrylate (BA), 24 g (100 mmol) of lauryl acrylate (DDA) and 14 g (200 mmol) of acrylic acid (AA), and 0.13 g of azobisisobutyronitrile (AIBN). While stirring at room temperature with a stirring rotational speed of approximately 270 rpm, nitrogen gas was introduced for 30 minutes at a flow rate of 400 ml/min, and the dissolved oxygen was removed. The nitrogen gas stream was then cut off and the flask was sealed and warmed to 65° C. for approximately 25 minutes in a thermobath. The same temperature was maintained for 14 hours for polymerization reaction to obtain acrylic resin E1. The polymerization rate was 98%. Also, the weight-average molecular weight (Mw) of E1, determined by GPC based on standard polystyrene, was 36,000.

F1 below was prepared as component (F).
F1: Trimethylsulfonium methyl sulfate represented by the following formula F1 (product of Fluorochem).

[Chemical Formula 18]

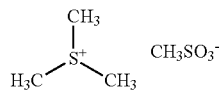

F1

H1 below was prepared as component (H).
H1: 3-Glycidoxypropyltrimethoxysilane represented by the following formula H1 (product of Shin-Etsu Chemical Co., Ltd., trade name: "KBM-403").

[Chemical Formula 19]

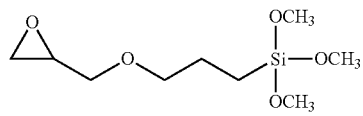

H1

I1 below was prepared as component (I).
I1: Ethyl lactate

Examples 1 to 9, Comparative Examples 1 to 4

Components (A) to (I) were combined in the prescribed proportions listed in Table 2. The solution was subjected to pressure filtration using a TEFLON® filter with 3 μm pores, to obtain photosensitive resin compositions for Examples 1 to 9 and Comparative Examples 1 to 4. In Table 2, the units are parts by mass, unless otherwise specified.

<Evaluation of Photosensitive Properties (Sensitivity and Post-Development Residue)>

The photosensitive resin compositions of Examples 1 to 9 and Comparative Examples 1 to 4 were each spin coated onto a silicon substrate and heated at 120° C. for 3 minutes, to form a coating film with a film thickness of approximately 12 to 14 μm. Next, an i-line stepper (trade name: "FPA-3000iW" by Canon Inc.) was used for reduction projection exposure of i-lines (365 nm) through a mask rendered with a test pattern. After exposure, development was carried out with a 2.38% aqueous solution of tetramethylammonium hydroxide (TMAH), and development was carried out until the residual film thickness reached about 80% to 95% of the initial film thickness. It was then rinsed with water to obtain a patterned resin film. The minimum exposure dose necessary for pattern formation was evaluated as the sensitivity.

Also, for evaluation of the post-developing residue (developability), a scanning electron microscope (SEM) was used for observation of the presence of any residue at the openings. An evaluation of A was assigned when residue in a range of less than 0.5 μm from the edges of the openings was present (or no residue was present), an evaluation of B was assigned when the residue was in the range of 0.5 to 1 μm, and an evaluation of C was assigned when the residue was in a range of greater than 1 μm.

The evaluation results for the photosensitive properties are shown in Table 2.

<Evaluation of Pattern Melting>

The patterned resin film obtained by the method described above was then subjected to heat treatment (curing) for 2 hours using a vertical diffusion furnace (trade name: "μ-TF" by Koyo Thermo System Co., Ltd.) in nitrogen at a temperature of 175° C. (temperature elevating time: 1.5 hours), to obtain a patterned cured film with a film thickness of approximately 10 μm. The results are shown in Table 2.

Also, for evaluation of pattern melting, an evaluation of A was assigned if the minimum diameter of the openings was less than 15 μm, an evaluation of B was assigned if it was 15 μm or greater and less than 30 μm and an evaluation of C was assigned if it was 30 μm or greater, all without melting and collapse of the heat-cured pattern.

<Evaluation of Cured Film Physical Properties (Breaking Elongation and Elastic Modulus)>

The photosensitive resin compositions of Examples 1 to 9 and Comparative Examples 1 to 4 were each spin coated onto a silicon substrate and heated at 120° C. for 3 minutes, to form a coating film with a film thickness of approximately 12 to 14 μm. A Proximity exposure device (trade name: PLA-600FA, by Canon Inc.) was used for total wavelength exposure of the coating film through a mask. Following exposure, a 2.38% aqueous solution of TMAH was used for development to obtain a 10 mm-wide rectangular pattern. The rectangular pattern of the coating film was then subjected to heat treatment (curing) for 2 hours using a vertical diffusion furnace (trade name: "μ-TF" by Koyo Thermo System Co., Ltd.) in nitrogen at a temperature of 175° C. (temperature elevating time: 1.5 hours), to obtain a cured film with a film thickness of approximately 10 μm. The cured film with a film thickness of approximately 10 μm obtained by the method described above was peeled from the silicon substrate, and the breaking elongation (EL) and elastic modulus (YM) of the released film were measured with an "AGS-H100N Autograph" by Shimadzu Corp. For the measurement, the width of the sample was 10 mm, the film thickness was 9 to 11 μm and the chuck gap was 20 mm. The pull rate was 5 mm/min, and the measuring temperature was approximately room temperature (20° C. to 25° C.). At least 5 test pieces obtained from a cured film obtained under the same conditions were measured and the average of the measured values was recorded as "breaking elongation" and "elastic modulus". The obtained results are shown in Table 2.

<Evaluation of Haze of Developed Film>

The photosensitive resin compositions obtained in Examples 1 to 9 and Comparative Examples 1 to 4 were each spin coated onto a glass plate and heated at 120° C. for 3 minutes, to form a coating film with a film thickness of approximately 10 to 12 μm. After then dipping in a 2.38% aqueous solution of TMAH, it was rinsed with water to obtain a measuring sample. The opacity (haze value) was measured using a haze meter (trade name: "NDH5000" by Nippon Denshoku Industries Co., Ltd., light source: white LED).

A lower haze value indicates lower haze (opacity), and it is preferably no greater than 3.

TABLE 2

| | | Example | | | | | | | | | Comparative Example | | | |
|---|---|---|---|---|---|---|---|---|---|---|---|---|---|---|
| | | 1 | 2 | 3 | 4 | 5 | 6 | 7 | 8 | 9 | 1 | 2 | 3 | 4 |
| (A) | A1 | 80 | 80 | 80 | 80 | 80 | 80 | 80 | 80 | 80 | 80 | 80 | 80 | 80 |
| | A2 | 20 | 0 | 0 | 0 | 0 | 0 | 0 | 0 | 0 | 0 | 20 | 0 | 0 |
| (B) | B1 | 15 | 15 | 15 | 15 | 15 | 15 | 15 | 15 | 15 | 15 | 15 | 15 | 15 |

TABLE 2-continued

|  |  | Example | | | | | | | | | Comparative Example | | | |
|---|---|---|---|---|---|---|---|---|---|---|---|---|---|---|
|  |  | 1 | 2 | 3 | 4 | 5 | 6 | 7 | 8 | 9 | 1 | 2 | 3 | 4 |
| (C) | C1 | 15 | 15 | — | — | — | — | — | — | — | — | — | — | — |
|  | C2 | — | — | 15 | — | — | — | — | — | — | — | — | — | — |
|  | C3 | — | — | — | 15 | — | — | — | — | — | — | — | — | — |
|  | C4 | — | — | — | — | 15 | 10 | 20 | 30 | 5 | — | — | — | — |
| (D) | D1 | 10 | 0 | 0 | 0 | 0 | 0 | 0 | 0 | 0 | 10 | 10 | 10 | 0 |
| (E) | E1 | 10 | 0 | 0 | 0 | 0 | 0 | 0 | 0 | 0 | 0 | 10 | 10 | 10 |
| (F) | F1 | 1 | 1 | 1 | 1 | 1 | 1 | 1 | 1 | 1 | 1 | 1 | 1 | 1 |
| (H) | H1 | 5 | 5 | 5 | 5 | 5 | 5 | 5 | 5 | 5 | 5 | 5 | 5 | 5 |
| (I) | I1 | 160 | 160 | 160 | 160 | 160 | 160 | 160 | 160 | 160 | 160 | 160 | 160 | 160 |
| Sensitivity (mJ/cm$^2$) | | 220 | 200 | 220 | 220 | 180 | 180 | 200 | 220 | 160 | 300 | 200 | 250 | 400 |
| Developability | | B | B | B | B | A | A | A | B | A | B | B | B | B |
| Pattern melting | | A | A | A | A | A | A | A | A | A | B | C | C | — |
| Breaking elongation (%) | | 22 | 22 | 22 | 23 | 22 | 22 | 22 | 22 | 20 | 15 | 23 | 15 | — |
| Elastic modulus (GPa) | | 2.5 | 2.5 | 2.4 | 2.5 | 2.5 | 2.4 | 2.5 | 2.6 | 2.5 | 3.0 | 2.6 | 2.8 | — |
| Haze value (%) | | 2.5 | 2.0 | 2.2 | 2.5 | 2.2 | 0.9 | 2.5 | 2.8 | 0.7 | 3.0 | 2.8 | 4.5 | — |

All of the photosensitive resin compositions obtained in Examples 1 to 9 had satisfactory film physical properties and pattern melt resistance, and low haze values. Presumably, by using an acrylic resin containing an epoxy group, crosslinking occurred between component (C) and the base resins, i.e. component (A), and therefore satisfactory film physical properties were obtained and the pattern melt resistance was improved. In addition, it is conjectured that interaction between component (A) and the epoxy groups and improved compatibility between the resins, caused the opacity of the cured film to be reduced. Also, satisfactory film physical properties could be obtained in Examples 2 to 9 even when component (A2), component (E) or component (D) was not present. This may be because component (C) underwent sufficient crosslinking with component (A). Furthermore, the photosensitive resin compositions obtained in Examples 1 to 9 had satisfactory developability and also improved pattern melt resistance. In Comparative Examples 1 to 3 where component (C) was not used, it was not possible to adequately reduce pattern melting and the haze value was high. Also, no pattern could be formed in Comparative Example 4 where component (C) was not used.

INDUSTRIAL APPLICABILITY

The photosensitive resin composition of the invention can be used to form surface protective layers and interlayer insulating layers on semiconductor elements to be mounted on electronic devices, as well as rewiring layers for semiconductor packages.

EXPLANATION OF SYMBOLS

1: Semiconductor substrate, 2: protective layer, 3: first conductive layer, 4: interlayer insulating layer, 5: photosensitive resin layer, 6A, 6B, 6C: window sections, 7: second conductive layer, 8: surface protective layer, 11: interlayer insulating layer, 12: wiring layer, 13: insulating layer, 14: surface protective layer, 15: pad section, 16: rewiring layer, 17: conductive ball, 18: core, 19: cover coat layer, 20: barrier metal, 21: collar, 22: underfill, 23: silicon chip, 24: joint, 100, 200, 300, 400: structures, 500, 600, 700: semiconductor devices.

The invention claimed is:

1. A photosensitive resin composition comprising:
   (A) an alkali-soluble resin having a phenolic hydroxyl group;
   (B) a compound that generates an acid by light; and
   (C) an acrylic resin having a group that crosslinks with the component (A),
   wherein the component (C) is an acrylic resin comprising a structural unit represented by the following formula (1):

(1)

wherein $R_1$ represents a hydrogen atom or a methyl group, and $R_2$ represents an organic group having a group that crosslinks with the component (A),
   wherein the group that cross links with the component (A) is epoxy group, and
   wherein the photosensitive resin composition comprises 1-50 parts by mass of the component (C) with respect to 100 parts by mass of the component (A),
   wherein the component (C) further comprises a structural unit represented by the following formula (2)

(2)

wherein $R_3$ represents a hydrogen atom or a methyl group, and $R_4$ represents a C4-20 alkyl group,
   wherein the component (C) further comprises a structural unit represented by the following formula (3) or (4), and

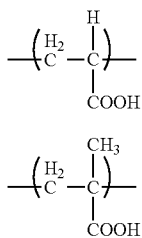 (3)

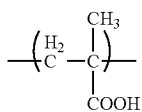 (4)

wherein the component (A) comprises at least one selected from the group consisting of a poly(hydroxystyrene)-based resin, a phenol resin, a polybenzooxazole precursor, a poly(hydroxyphenylene)ether, a polynaphthol and a mixture thereof.

2. The photosensitive resin composition according to claim 1, wherein the component (A) is a phenol resin.

3. The photosensitive resin composition according to claim 1, wherein the component (B) is an o-quinone diazide compound.

4. The photosensitive resin composition according to claim 1, further comprising (E) an acrylic resin that does not contain a group that crosslinks with the component (A).

5. The photosensitive resin composition according to claim 1, further comprising (F) a heat acid generator.

6. The photosensitive resin composition according to claim 1, wherein the compositional ratio of the structural unit represented by formula (1) in the acrylic resin of component (C) is 1 to 25 mol % with respect to the total amount of component (C).

7. A method for manufacturing a patterned cured film, the method comprising coating the photosensitive resin composition according to claim 1 onto a substrate and drying the coated photosensitive resin composition to form a resin film, exposing the resin film to light, developing the exposed resin film with an aqueous alkali solution to form a patterned resin film, and heating the patterned resin film.

8. The method for manufacturing a patterned cured film according to claim 7, wherein a heating temperature in the heating of the patterned resin film is no higher than 250° C.

9. An electronic component having a patterned cured film produced by the method for manufacturing a patterned cured film according to claim 7 as an interlayer insulating layer or a surface protective layer.

10. The electronic component having a patterned cured film produced by the method for manufacturing a patterned cured film according to claim 7 as a cover coat layer, core, collar or underfill.

* * * * *